(12) United States Patent
Morita et al.

(10) Patent No.: US 6,336,775 B1
(45) Date of Patent: Jan. 8, 2002

(54) GAS FLOATING APPARATUS, GAS FLOATING-TRANSPORTING APPARATUS, AND THERMAL TREATMENT APPARATUS

(75) Inventors: Makoto Morita, Nishinomiya; Yuji Tsutsui, Hirakata; Masaru Yoshida; Nobuhito Yokoyama, both of Katano; Kenji Tanimoto, Kobe, all of (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 0 days.

(21) Appl. No.: 09/372,671

(22) Filed: Aug. 12, 1999

(30) Foreign Application Priority Data

| Aug. 20, 1998 | (JP) | 10-234063 |
| Aug. 20, 1998 | (JP) | 10-234064 |
| May 7, 1999 | (JP) | 11-127115 |
| May 10, 1999 | (JP) | 11-128537 |

(51) Int. Cl.⁷ .............................................. B65G 53/16
(52) U.S. Cl. ........................ 406/88; 406/51; 198/721; 414/676; 432/239
(58) Field of Search ............... 406/51, 77, 88; 198/721; 414/676; 432/239

(56) References Cited

U.S. PATENT DOCUMENTS

| 3,425,818 A | * | 2/1969 | Plumat | 65/182 |
| 3,473,910 A | * | 10/1969 | Wilde et al. | 65/182 |
| 3,731,823 A | * | 5/1973 | Goth | 302/31 |
| 4,144,021 A | * | 3/1979 | Neumann | 302/2 R |
| 4,676,742 A | * | 6/1987 | Kozierok et al. | 406/88 |
| 4,738,748 A | * | 4/1988 | Kisa | 406/88 |
| 5,497,987 A | * | 3/1996 | Henn et al. | 406/88 |
| 5,571,010 A | * | 11/1996 | Okase | 432/239 |
| 5,836,759 A | * | 11/1998 | Thomas et al. | 432/239 |

FOREIGN PATENT DOCUMENTS

| JP | 53-24672 | 3/1978 |
| JP | 5-29238 | 2/1993 |

\* cited by examiner

*Primary Examiner*—Christopher P. Ellis
*Assistant Examiner*—Jae Dillon, Jr.
(74) *Attorney, Agent, or Firm*—Wenderoth, Lind & Ponack, L.L.P.

(57) ABSTRACT

A gas floating-transporting apparatus transports a material to be treated along a predetermined direction in a thermal space so as to thermally treat the material to be treated. The apparatus includes a gas floating mechanism and a transporting mechanism. The gas floating mechanism includes a gas ejection device which expels the gas toward a portion of the material to be treated on which a floating force is acted so as to float the material to be treated, and a gas supply device which supplies the gas to the gas ejection means. The transporting mechanism includes an abutting member which abuts a trailing end of the floated material to be treated and moves along the predetermined direction, and which pushes the material to be treated by the movement thereof, whereby the floated material to be treated is moved along the predetermined direction.

5 Claims, 19 Drawing Sheets

FIG. 7
(a) Before Movement
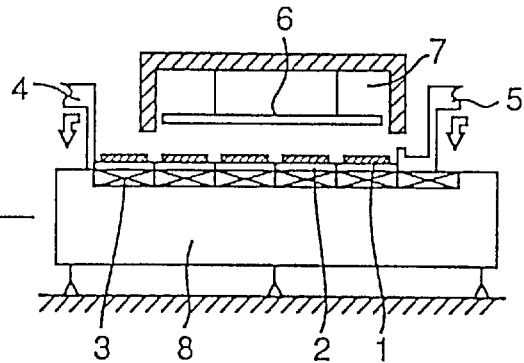
(b) Gas Floating Step
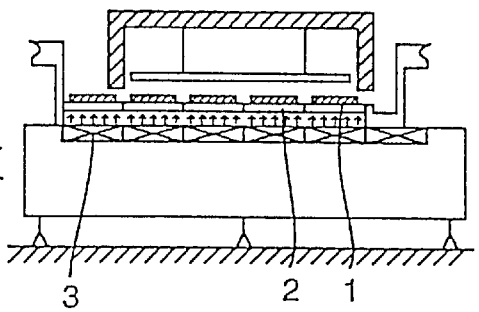
(c) Moving-Transporting Step
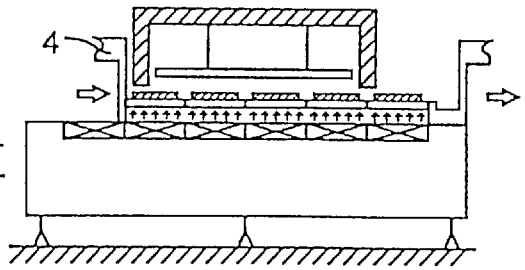
(d) Gas Supply Stop
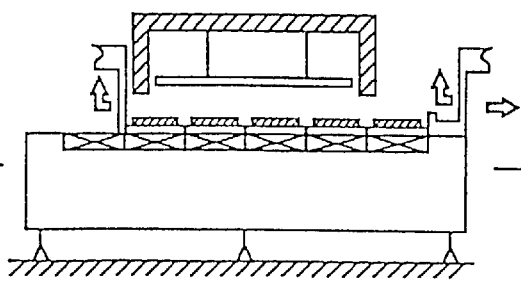

- Floating Air – Off (valves are closed.)
- Glass substrates are placed on base plate.

GAS FLOATING APPARATUS, GAS FLOATING-TRANSPORTING APPARATUS, AND THERMAL TREATMENT APPARATUS

BACKGROUND OF THE INVENTION

1. Field of the Invention

The present invention relates to a gas floating apparatus which floats, with a gas, an object as a material to be treated such as a raw material, a part or an intermediate product which is for the production process of a final product such as a plasma display panel or a solar battery panel; a gas floating-transporting apparatus which floats and transports such an object; and a thermal treatment apparatus which thermally treats such an object as well as a gas floating method which floats an object as a material to be treated; a gas floating-transporting method which floats and transports such an object and a thermal treatment method of such an object.

2. Related Art

Various thermal treatments such as heating and cooling treatments are used in production processes of various products. Concretely, a number of effects are known which are provided by drying, firing, seal-bonding, evacuation, annealing and other thermal treatments.

For example, it has been proposed to transport materials to be treated using a mesh conveyer belt, a roller hearth or the like so as to thermally treat them by passing them through a heating furnace in the form of a dome or a tunnel in order to improve effectiveness of the thermal treatment.

A thermal treatment apparatus of a mesh belt transport type with electric resistive heating which is generally used for the production of electronic parts is schematically shown in FIG. 19 in a perspective view. In the thermal treatment apparatus 1100, a mesh belt 1106 moves continuously in one direction through a tunnel made of a metal material, and the tunnel is called a heating muffle 1104 which is surrounded by electrically resistive heating blocks 1102. The material to be treated 1108 is moved from a loading side (or a loader) 1110 to an unloading side (or an unloader) 1112 while being supported on the mesh belt 1116. The material to be treated 1108 is heated at a predetermined temperature while it is passed through the heating muffle 1104. After the mesh belt 1106 and the material to be treated 1108 have passed through the zone surrounded by the heating blocks 1102, they are cooled while passing through a cooling muffle 1116 which is equipped with a cooling pipe 1114.

In the heating furnace used for the purpose of the thermal treatment, there are generally provided, along a transporting direction of the material to be treated, a temperature elevating zone where the material to be treated is heated, a temperature keeping zone where the heated material to be treated is kept at the elevated temperature, and a temperature decreasing zone where the temperature of the material to be treated is lowered, whereby the material is thermally treated as predetermined while it passes through those zones in turn. Usually, an amount of heat is added in the temperature elevating zone, and an amount of heat corresponding to heat loss is added in the temperature keeping zone while heat is removed in the temperature decreasing zone.

As a heater used in the heating furnace for the thermal treatment of the electronic parts, there are electrically resistive heating by means of an electric energy, image heating by means of lump irradiation, heating by means of combustion heat through burning of for example gas fuel, and these heaters can be used alone or in combination. In order to keep the thermal treatment condition which is stable and not affected by the heat load of, for example, the materials to be treated, a thermal treatment space comprising an atmosphere of which heat capacity is large is required to be formed. Thus, internal structures of the thermal treatment apparatus which form the thermal treatment space also have to be heated using the above heating manner.

In the conventional thermal treatment manner as described above, when all the materials to be treated are uniformly heated, kept at their temperatures and cooled during their thermal treatment, a large thermal treatment space is required, and thus a heat energy loss by means of such a thermal treatment space is also very large. In order to keep such a large thermal treatment space, there is a problem in that a ratio of a heat energy which has been effectively consumed by the materials to be treated through the heating treatment (i.e. effectively reserved heat) to a heat energy which has been supplied to the thermal treatment apparatus is small, so that most of the supplied heat energy is wasted, which leads to a high cost of the thermal treatment.

As described above, FIG. 19 schematically shows a partly cut-away perspective view of a usual thermal treatment apparatus of the mesh belt transportation type which is used for the thermal treatment of the electronic parts and the like, and the inside of the apparatus can be seen. For example, the following reasons why a heat energy utilization efficiency of such an apparatus is law can be conceived:

A heat balance sheet of a conventional thermal treatment apparatus is shown in FIG. 20. The calculation of the heat balance is based on an amount actually being supplied to the thermal treatment apparatus corresponding to 100%. With a typical heating furnace of the tunnel type through which a conveyer for the materials to be treated moves, since an inlet and an outlet of the apparatus are always open, a portion of the heat supplied to the heating furnace escapes from the outlet and the inlet. An amount of such escaping heat would be as much as about 30% of the supplied total heat energy.

Further, in the thermal treatment apparatus, the conveyer in addition to the materials to be treated has to be heated, so that a large amount of heat is consumed for heating the conveyer. In order to heat the conveyer which is of a complicated mechanism and of which heat capacity is large, a large amount of heat is required. When the conveyer leaves the heating furnace, an amount of heat supplied to the conveyer in the thermal treatment apparatus dissipates to the outside so that such heat is wasted. Every time when the conveyer recirculates to enter and leave the thermal treatment apparatus during its circulation, a large amount of heat is added to the conveyer and such an amount dissipates to the outside without being utilized. The heat loss by means of the conveyer would be as much as about 20% of the supplied total heat energy.

In addition, with the conventional thermal treatment technology, an amount of heat energy lost outside through a wall of the heating furnace is large, which would be as much as about 45% of the supplied total heat energy.

As a result, it is said that only not more than 5% of the totally supplied energy is used for the thermal treatment of the material to be treated, and thus very ineffective thermal treatment is currently carried out.

Throughout the present specification, the term "thermal treatment" means a treatment of temperature increasing, temperature maintaining, temperature decreasing, or any combination thereof of the material to be treated. Thus, for the purpose of the thermal treatment, heat may be added to the material to be treated or heat may be removed from the material to be treated, or any combination thereof may be possible (optionally thermal insulation may be included). By means of such thermal treatment, at least one property of the material to be treated (for example, a water content, a weight, an electric resistance, a permeability, a thickness of a resulted film or its uniformity, an internal stress or strain, a strength, a composition or the like) is changed as predetermined.

For example, the treatment in which an amount of heat is added to the material to be treated includes a treatment in which the material to be treated is heated to a predetermined temperature in a predetermined period, a treatment in which the material to be treated is kept at a predetermined temperature for a predetermined period, and a treatment in which the material to be treated is subjected to a predetermined temperature changing condition. Further, the treatment in which an amount of heat is removed from the material to be treated includes for example a treatment in which a temperature of the material to be treated is lowered by a manner wherein no heat is added (namely, spontaneously cooling), or by a manner wherein a forced cooling is carried out while a cool air is blown using a power, or an amount of heat is absorbed by contacting with a heat absorbing or heat radiating surface of which temperature is controllable to a predetermined temperature.

SUMMARY OF THE INVENTION

It is therefore an object of the present invention to overcome the above problems related to the thermal treatments of the various materials to be treated, for example, in the production of the plasma display panel and the solar battery panel, and to provide a floating apparatus and a gas floating-transporting apparatus for a material to be treated as an object as well as a floating method and a transporting method of such a material which are applicable to a thermal treatment apparatus and a thermal treatment method which improves a heat energy utilization efficiency by minimizing an amount of a gas used for the treatment, whereby improving productivity and producing an intermediate product or a final product having a improved quality.

Particularly, the present invention relates to a transporting method and apparatus which is applicable to a thermal treatment apparatus (for example, a thermal treatment apparatus used for the production of the plasma display panel or the solar battery panel). The present invention provides a novel gas floating-transporting apparatus which floats (or lifts up) and transports a material to be treated using a gas by incorporation of gas ejection into transportation as a simple transportation apparatus and which eliminates a large amount of heat energy loss from the added total heat energy to the thermal treatment apparatus as much as possible, which is different from the conventional transportation means such as mesh belt transportation or roller-hearth transportation.

A basic technology as to floating-transporting a material to be treated has been hitherto known. For example, as to an apparatus which floats and transports a substrate in a thermal treatment space, a thermal diffusion apparatus has been proposed in Japanese Patent Kokai Publication No. 5-29238 (Applicant: Sharp Corporation) in which a semiconductor substrate is heated by radiating a heating light while being floated by blowing an inert gas against its both surfaces, and simultaneously thermal diffusion of an impurity (i.e. dopant) into predetermined portions of the substrate surface is carried out.

However, considering practicability, it is very difficult to carry out floating-transporting control (i.e. to stably halt the object after it has been transported surely in a predetermined period while keeping its predetermined level) by means merely of an action of a gas in a high temperature atmosphere. Even though it is possible to carry out doing so, it is easily expected that a cost for means which controls a gas flow rate used for floating and transporting of the substrate would be extremely high. Thus, when use heat energy which is otherwise wasted is used effectively while keeping a product quality by means of the thermal treatment, it is desired to provide a floating-transporting method and an apparatus therefor which is more practical, less expensive and further reliable so that the gas floating-transporting is applied to a practical production process.

In the first aspect, the present invention provides a gas floating apparatus which ejects a gas toward an object through a gas ejection openinig of a gas ejection means at a predetermined ejection speed within a range between a subsonic speed and a sonic speed, whereby the object is floated. Further, the present invention provides a method for floating an object by ejecting a gas toward the object at a predetermined ejection speed within a range between a subsonic speed and a sonic speed at an gas ejection opening of a gas ejection means. It is noted that the gas ejection means is a member (such as a nozzle) which has at its one end the gas ejection opening which is an aperture ejecting the gas toward the object. The gas is supplied to such gas ejection means from a gas supply means (for example a pump, a conduit and the like).

The present invention as outlined above is based on the following consideration of a force applied by the gas. The used gas may be any suitable gas. For example an atmosphere gas which is required to form a treatment space or a thermal treatment space such as air, nitrogen, hydrogen or any other process gas may be used.

A force (F) acting on a surface which is perpendicular to an ejection direction of the gas which has been ejected from the gas ejection opening of the gas ejection means such as a nozzle, which force corresponds to a floating force (or floatage) which acts on the object or the material to be treated), has the following relationship (1) with a gas density (ρ), a gas flow rate (Q), and a gas ejection speed (V):

$$F = \rho Q V \quad (1)$$

That is, when the same floating force is to be obtained, the density (ρ) or the ejection speed (V) should be increased when the flow rate (Q) is to be decreased. Further, using the equation of state of a real gas (2), the gas density (ρ) can be expressed as follows:

$$\rho = P/(zRT) \quad (2)$$

wherein P is a gas pressure, z is a compression factor, and T is a gas temperature (absolute temperature).

Therefore, in order to increase the gas density (ρ), there is no other way than that the gas pressure (P), and thus the pressure of the thermal treatment atmosphere is increased or the gas temperature T (absolute temperature), and thus the temperature of the thermal treatment atmosphere is decreased, or a kind of the gas is changed. Usually, the gas kind and the condition of the thermal treatment atmosphere are fixed due to other requirements, the pressure (P) as well as the temperature (T) cannot be changed. For example, the pressure (P) cannot be increased since a gas supply system requires high pressure conduits. Also, the temperature (T) cannot be decreased since a cooling apparatus is required when the temperature is lowered below the normal temperature.

Thus, in order to increase the floating force (F), there is no other way than that the gas ejection speed (V) is increased. On the other hand, when the gas ejection speed is excessively large, some device is required with regard to the gas ejection means such as a nozzle, and as a result the gas ejection means becomes expensive.

Under the above considerations, it has been found that in order to use the gas ejection means easily and less expensively, the gas ejection speed is preferably any predetermined one in the Mach number range between about 0.4 and 1.0, namely in the range between a subsonic speed and a sonic speed (i.e. about 340 m/sec. at the atmosphere temperature and the atmospheric pressure), especially preferably in the range between about 125 m/sec. and 340 m/sec. at the atmosphere temperature and the atmospheric pressure and more preferably in the range between about 275 m/sec. and 325 m/sec. at the atmosphere temperature and the atmospheric pressure, and thereby an amount of the gas used for the object floating can be minimized. The predetermined speed may be changed or constant, and it is properly selected depending on natures of the object (such as a weight, a base (or bottom) area and the like) while considering an intended level (or height) or amount to be floated. Alternatively, the gas speed may be suddenly achieved up to the predetermined speed in a step or gradually increased from zero speed to the predetermined speed.

When the gas speed (or the gas ejection speed, V) is fixed constant, what limits the gas flow rate is the cross-sectional area of the gas ejection opening of the gas ejection means such as a nozzle (thus, an opening diameter). In order to obtain the above mentioned ejection speed, in the case of a nozzle having a circular cross-section, the opening diameter is preferably in the range of, for example, between about 0.3 mm and about 1 mm, and the gas pressure is preferably in the range of, for example, between 0.1 MPa and 0.9 MPa at just before the gas ejection opening.

In the second aspect, the present invention provides a gas floating-transporting apparatus which floats a material to be treated by a gas and transports the material to be treated along a predetermined direction in a thermal treatment space so as to thermally treat the material to be treated and which comprises a gas floating means. The gas floating means comprises a gas ejection means which expels the gas toward a portion of the material to be treated on which a floating force is acted so as to lift up (or float) the material to be treated, and a gas supply means which supplies the gas to the gas ejection means. The transporting means comprises an abutting member which abuts a trailing end of the floated material to be treated and moves along said predetermined direction, and which pushes the material to be treated by the movement thereof, whereby the floated material to be treated is moved along said predetermined direction. It is noted that the number of units of the material to be treated can be one or plural. When it is plural, the plurality of units of the material to be treated may be arranged side-by-side along said predetermined direction, which is usual.

In a preferable embodiment, the gas floating means further comprises a base plate which includes a gas ejection opening(s), and the material to be treated which has been floated above the base plate can placed on the base plate when the gas ejection is stopped, and then treated, for example thermally treated, on the base plate as predetermined if necessary. After the treatment has been completed, when the gas is ejected again, then the material to be treated can be transported to a predetermined position. Thereafter, the gas ejection is again stopped, so that the material to be treated is placed on the base plate, and again treated as desired.

Further, the present invention provides a method in which a material to be treated is floated by a gas using a gas floating means and transported by a transporting means along a predetermined direction in a thermal treatment space so as to thermally treat the material to be treated. The gas floating means ejects a gas (which is supplied from a gas supply means) toward a portion of the material to be treated through a gas ejection means. The transporting means comprises an abutting member which moves along said predetermined direction, so that the abutting member abuts a trailing end of the floated material to be treated, and pushes the material to be treated by the movement thereof, whereby the floated material to be treated is moved in said predetermined direction. In a particularly preferable embodiment, the material(s) to be treated is placed on a transporting member, which the abutting member moves along said predetermined direction. In a preferable embodiment, the gas floating means further comprises a base plate which includes a gas ejection opening(s). By repeating floating of the material to be treated above the base plate by means of the ejection of the gas using the gas ejection means, moving of the material to be treated by the transporting means and positioning of the material to be treated on the base plate by stopping the gas ejection of the gas floating means, the material to be treated is moved intermittently.

In the present invention, the term "material to be treated" is an object (or a matter) to be transported through a thermal treatment space (which usually accommodates a plurality of the objects and may be horizontally elongated). For example, the materials to be treated may be various substrates, and may be in the form of a plate or a sheet. The material to be treated has, as a portion thereof, a surface onto which the gas is ejected so that the floating force acts on the surface. The number of units of the object is not particularly limited, and it may be one or more. Usually, the number may be any in the range between about two to about thirty. Selection of the actual number may be easily carried out by those skilled in the art depending on a thermal treatment type, productivity, an apparatus cost and so on. It is to be noted that the present invention does not exclude the thermal treatment of a single material to be treated, but it is very ineffective to thermally treat an object, alone from a viewpoint of a treatment efficiency. The materials to be treated as described above are arranged side-by-side along the predetermined direction in the thermal treatment space and transported along that direction. During the transportation, the materials to be treated are thermally treated as predetermined.

The term "thermal treatment" may mean adding heat to the object (including heating for the purpose of maintaining temperature), removing heat from the object (including cooling for the purpose of maintaining temperature), having the object be in an adiabatic state, or any combination thereof. Depending on the thermal treatment, the thermal treatment space comprises a thermal means. Thus, while the material to be treated is transported through the thermal treatment space, the thermal means (for example, a heating means, a cooling means, an insulating means and the like) provided in the thermal treatment space treats the material to be treated as predetermined. The term "predetermined direction" is a direction beforehand determined along which the material to be treated is to be moved through the thermal treatment space, and usually it may be horizontal.

The gas floating means is composed of the gas ejection means and the gas supply means, and it is not particularly limited as far as it applies the floating force to the material to be treated so as to float it by ejecting the gas toward a portion of the material to be treated (usually a bottom surface of the material to be treated) on which the floating force is acted. The material to be treated is often a plate or a sheet form (namely, a thing of which thickness is smaller than the other dimensions (such as a length, a width, and a depth), and in such a case, the gas is ejected toward a reverse (or back) side of the material to be treated. Generally, a gas which is inert to the material to be treated (usually air, nitrogen or any other process gas forming the thermal treatment space) is ejected from "the gas ejection means" such as a nozzle or a porous (or perforated) plate which includes one or more gas ejection openings. "The gas supply means" controls the gas ejected from the gas ejection means toward the material to be treated (particularly, a pressure and/or a flow rate of the gas) so that the stable floating level or height is ensured.

In the gas floating-transporting apparatus according to the present invention, the transportation of the material to be treated through the thermal treatment space is carried out by means of the abutting member which the transporting means includes. The abutting member abuts the rear (or trailing) end of the material to be treated and moved in the thermal treatment space, and pushes the material to be treated forward along the predetermined direction so as to transport the material.

The transporting means comprises the abutting member which abuts the rear end of the floating material to be treated and moves along the predetermined direction, and the abutting member which is moving along the predetermined direction pushes the material to be treated which is being floated, so that the material to be treated is mechanically moved toward the predetermined direction. The transporting means as described is able to surely transport the material to be treated at a predetermined time to a predetermined position, and it may be referred to as a "pushing type transporting means". The material to be treated is being floated at least when it is moved as described above. Thus, when it is not moved, the material to be treated may be or may not be being floated. However, in order to save an amount of the gas used, the material to be treated is preferably floated by the supply of the gas only when the object is moved.

The thermal treatment of the material to be treated is carried out by passing it through the thermal treatment space which has been set at a predetermined thermal condition. Thus, usually, the treatment is carried out during a period when the material to be treated is being floated (a period when the material to be treated is moved by means of the transporting means and periods when the material to be treated is being stopped after and before its movement) and a period when the material to be treated is not being floated (a period when the material to be treated is located at the bottom of the thermal treatment space due to the stop of the floating gas supply). When it is possible to stop the thermal treatment only during the material to be treated is being floated, the thermal treatment may not be carried out upon being floated.

It is noted that as the gas floating means as described above, what has been publicly known can be used, which is disclosed in for example Japanese Patent Kokai Publication No. 53-24672. Any publicly known gas floating means may be used in the gas floating-transporting apparatus according to the present invention as far as it is able to float the material to be treated up to a predetermined level. In a particularly preferable embodiment, the gas floating apparatus according to the first aspect of the present invention as described before is used as the gas floating means. In this embodiment, the object of the gas floating apparatus of the first aspect corresponds to the material to be treated.

That is, upon floating the material to be treated in the gas floating-transporting apparatus of the second aspect, it is characterized in that the gas which applies a force to float the material to be treated is ejected toward the material to be treated at a predetermined ejection speed in the range between a subsonic speed and a sonic speed at the gas ejection opening of the gas ejection means. With the gas floating-transporting apparatus, the pressure of the gas to be ejected is controlled so as to achieve such an ejection speed, and thereby an amount of the gas required for floating is minimized to the utmost.

Further, the present invention provides a gas floating-transporting method in which when the material to be treated is transported while it is being floated by a gas, the gas which applies the force to float the object is ejected toward the material to be treated at an ejection speed in the range between a subsonic speed and a sonic speed at the gas ejection opening of the gas ejection means, and the material to be treated is moved by means of the transporting means.

In the third aspect, the present invention provides a thermal treatment apparatus for a material to be treated which includes a thermal treatment space comprising the gas floating-transporting apparatus according to the present invention as described above. In addition, the present invention provided a method to thermally treat a material to be treated comprising, while using the gas floating-transporting apparatus as described above, carrying out at least once each of the following steps. First, floating the material to be treated by ejecting the gas by means of the gas floating means. Secondly, transporting the material to be treated along the predetermined direction by means of the transporting means. Thirdly, stopping the gas ejection so as to place the material to be treated on the base plate (or the bottom) of the thermal treatment space in the sequence of the first step, the second step, and the third step (note: the initial step may be any one of those steps). As a result, the material to be treated is passed through the thermal treatment space while it is retained therein temporarily, and it is thermally treated by being subjected to the thermal treatment condition while it is passed through the thermal treatment space. That is, the thermal treatment is carried out while the sequence of floatation→transportation→placement is repeated.

Usually, the material to be treated passes through the thermal treatment space while repeating the above first to third step sequence a plural number of times. The sequence can be begun by any of the steps, and for example, the sequence may start from the second step (2) (in this case, the order of the steps is as follows: second→third→first→ . . . →first→second→third. Alternatively, it may start from step three (in this case, the order of the steps is as follows: third→first→second . . . →first→second.

That is, by carrying out the step sequence first to third at least once, the material to be treated is retained in the thermal treatment space temporarily, and then moved (thus, the material to be treated is transported intermittently through the space). Which step is to be carried out first, and which step is to be carried out last depend on how to supply the material to be treated to the thermal treatment space (for example, a manner of supplying it while being floated or while being placed) and how to take out the material to be treated therefrom (for example, a manner of taking out it while being floated or while being placed).

It is preferable that a period between steps three and one (namely, a period in which the material to be treated is being placed on the base plate) is set considerably longer, and the thermal treatment is mainly carried out during that period. Such thermal treatment is conveniently carried out using the thermal treatment apparatus according to the present invention. In this case, when the gas ejection is stopped, the material to be treated is placed on the base plate, and when the gas is ejected toward the material to be treated, the material to be treated is floated above the base plate. Thus, the base plate includes the gas ejection opening(s).

The gas floating apparatus and the gas floating-transporting apparatus according to the present invention will be explained hereinafter mainly by means of an embodiment in which the apparatus is incorporated into the thermal treatment apparatus (thus, an embodiment of the thermal treatment apparatus according to the present invention). However, the gas floating apparatus and the gas floating-transporting apparatus according to the present invention may be used separately or in combination thereof for other applications rather than the thermal treatment. For example, the gas floating apparatus may be used for another application in which an object is to be floated, so that an amount of the required gas may be reduced. For example, the gas floating-transporting apparatus may be used for another application while being combined with a publicly known gas floating apparatus or the gas floating apparatus according to the present invention in which in the other application, a material to be treated is passed through a predetermined space. Further, in the thermal treatment apparatus according to the present invention, a publicly known gas floating apparatus may be used in place of the gas floating apparatus according to the present invention.

In one embodiment, the thermal treatment apparatus according to the present invention comprises, in the thermal treatment space, the gas floating-transporting apparatus according to the present invention, which comprises, as the gas floating apparatus, the gas floating apparatus according to the first aspect of the present invention. The gas floating means floats the material to be thermally treated. The means is composed of the gas ejection means such as a nozzle which ejects the gas toward the material to be treated from its reverse side so as to apply the floating force to float the material to be treated, and the gas supply means which controls an amount of the ejected gas so as to ensure the stable floating level or height of the material to be treated. The gas supply means pressurizes a gas up to a predetermined pressure and stably ejects the gas through the gas ejection opening so as to ensure the predetermined floating level or height of the material to be treated.

It is noted that the floating level or height is not particularly limited. However, when the floating level is excessively large, the ejected gas does not contribute to floating, but merely passes through a space between the material to be treated and the base plate and escape from the periphery of the object, which leads to the increase of an amount of the wasted gas. On the other hand, when the floating level is excessively small, the object may contact the base plate so that a quality of the material to be treated may be degraded. Considering those, a particularly preferable floating height (i.e. a distance between the base plate and the material to be treated) in the present invention is in the range between about 0.2 mm and 1 mm above the base plate.

The thermal treatment apparatus according to the present invention comprises the transporting means in the thermal treatment space as described above, and thereby the material to be treated can be transported to the predetermined position in the predetermined period. For example, a member(s) which abuts the material to be treated (for example, a member(s) which abuts a trailing end (with respect to the transporting direction) and optionally a leading end of the material to be treated) is mounted on a chain-belt or the like, and the member can push or stop the material to be treated by a moving or stopping action of the chain-belt when the chain-belt is moved or stopped. By means of such transporting means, the material to be treated is transported through the thermal treatment space as desired (for example, up to the predetermined position in the predetermined period) while being floated therein, then stopped, and placed on the base plate by stopping the gas ejection, and the thermal treatment of the object is carried out on the base plate optionally followed by being floated and transported to the next position, where the next thermal treatment is carried out again. Under the conditions of the thermal treatment space, the thermal treatment is carried out when the gas is stopped so that the object is not floated, but it may be carried out while the material to be treated is floated.

In the thermal treatment apparatus according to the present invention, as to a supply pressure of the gas used for the floatation, a pressure drop through the gas supply conduit system as well as a pressure drop at the gas ejection opening has to be taken account into. Even when considering a cost required for the production of a compressed gas, it is sufficient that the pressure of the gas ejection means is usually 4 kgf/cm$^2$ or less, for example 1 to 2 kgf/cm$^2$ (although depending on the ejection speed). This pressure is at an inlet of the gas ejection apparatus.

In one preferable embodiment according to the present invention, the gas floating means is composed of the base plate having the gas ejection means, and the material to be treated is floated above the base plate, and moved by the transporting means above the base plate. The thermal treatment apparatus according to the present invention including such a gas floating means comprises a plurality of the gas floating means which are arranged in series along the moving direction of the material to be treated (it is noted that the series of the gas floating means may be arranged as a single row or a plurality of rows).

With such a gas floating means, the gas ejection speed is at a predetermined one preferably in the range between the subsonic speed and the sonic speed by controlling an amount and/or a pressure of the gas supplied to the gas ejection means by means of the gas supply means.

The movement (or transportation) of the material to be treated is carried out by the transporting means as described above. When the object, while being floated, comes to a predetermined point where the thermal treatment is to be carried out, the movement of the object is stopped and the supply of the ejected gas which floats the object is stopped, and the material to be treated is thermally treated while it is placed on the base plate.

In one embodiment of the gas floating-transporting apparatus according to the present invention, the material to be treated is placed on the transporting member, which is passed through the thermal treatment space. That is, in the gas floating-transporting apparatus according to the present invention, the transporting member in place of the material to be treated is floated by the gas and moved along the predetermined direction by means of the transporting means, and as a result, the material to be treated placed on the member is transported. It is preferable that such a transporting member is substantially unsusceptible to the thermal treatment atmosphere for the material to be treated and does not substantially affect the material to be treated adversely in the thermal treatment atmosphere. Usually, the transporting member is preferably made of a quartz glass material, a ceramic material or a metal material. The transporting member preferably has a surface which is likely to receive the floating force by the ejected gas from the gas ejection means. Thus, it is generally preferable that the transporting member is in the form of a rectangular plate or relatively shallow depth tray on which the object(s) is placed. The gas is ejected toward a back side of such a transporting member and the material to be treated is placed on a surface of the opposite side.

When such a transporting member is used as described above, sure transportation is possible irrespective of the form of the material to be treated. Further, the material to be treated may be deformed due to its weight depending on the thermal treatment conditions, but such deformation is prevented when the transporting member is used. For example, in the case in which a high temperature gas is ejected from the gas ejection means so that the floating of the material to be treated is intended to be carried out simultaneously with the thermal treatment of the material to be treated, when the high temperature gas is directly ejected to the material to be treated for floating, there may occur broad temperature distribution across the object which results in non-uniform thermal treatment, thermal strain due to a residual stress to in the treated material, or breakage of the material to be treated because of rapid heating or cooling. However, when the transporting member is used, such direct heating may be avoided. Alternatively, it is of course possible to eliminate heating by means of the ejected gas and to use the other heating means.

In one embodiment according to the present invention, the abutting member is a leading end of the material to be treated (or the transporting member) which contacts with another material to be treated (or the transporting member) which is located adjacently in front of the former material to be treated (or the transporting member). That is, in this embodiment, the materials to be treated are arranged side-by-side along the predetermined direction, and one certain material to be treated is pushed by the material to be treated which is immediately after the former material to be treated. Thus, when a successive material to be treated, particularly its leading end contacts with a trailing end of a precedent material to be treated and is pushed forward by means of some action, the precedent material to be treated is moved forward. In the case in which a plurality of the materials to be treated are so arranged side-by-side in series that they are in contact with each other, such movement of the materials to be treated are carried out by applying a forward force from the outside to the last material to be treated, and in turn propagating the force to the preceding materials to be treated one after another. Thus, the force which pushes mechanically forward the last material to be treated of the materials to be treated arranged in series side-by-side may be applied by for example a pusher. The transportation manner as described may be referred to as a one-after-another type manner, a successive manner or a plug flow type manner. In this embodiment, since the materials to be treated (or transporting members) directly contact with each other, it is generally more preferable that a contact area between the materials to be treated (or transporting members) arranged in series is larger, or a thickness of the material to be treated or a thickness direction dimension (i.e. a dimension perpendicular to the transporting direction) of the transporting member at its end in the transporting direction is larger. It is noted that the transporting member is not particularly limited, and for example it may be in the form of a tray, a sheet of which thickness is larger than that of the material to be treated, or a platform.

In another embodiment, of the present invention, the materials to be treated are moved along the predetermined direction by being pushed by means of the abutting members which are so fixed on a continuous (or endless) member moving in the thermal treatment space along the predetermined direction that they are spaced evenly by a distance (or interval) which is substantially equivalent to at least a length of the material to be treated. In this embodiment, the abutting members are so arranged on the re-circulating continuous member (such as a belt, a chain, a wire or the like) that it can abut at least a portion of the trailing end of the material to be treated. The continuous member is continuously moved along the predetermined direction by a rotating driving force of, for example, a motor through a proper roller, a gear and the like. In the case in which a plurality of the materials to be treated are to be moved, the number of the abutting members corresponds to the number of the materials to be treated which are accommodated in the thermal treatment space together, and such number of the abutting members are fixed on the continuous member. Therefore, each abutting member abuts and pushes the trailing end of each material to be treated or transporting member.

Each of the abutting members is fixed while spaced from its adjacent abutting member generally by an even distance. Since the material to be treated has to be placed between the two adjacent abutting members, the distance between them corresponds to at least a length of the material to be treated (i.e. a size of the material to be treated along the predetermined direction). At least one continuous member should be provided along the predetermined direction in the thermal treatment space, and for example the member is arranged along one edge or a center line of the space. Preferably, two continuous members are provided along the both edges of the thermal treatment space.

In a further embodiment of the present invention, the abutting members are arranged on portions of peripheries of an elongated member. The elongated member is able to move linearly and reciprocally along the predetermined direction and the opposite direction (back and forth). When the abutting members are in contact with the materials to be treated (i.e. the abutting condition is in an "on" state), the elongated member moves forward. After the elongated member has moved forward by a predetermined distance, the abutting condition is released. By rotating the elongated member around its axis (or its longitudinal direction) which member has the abutting members around the portions of the peripheries thereof, the abutting condition in which the abutting members are in contact with the materials to be treated is released (namely, the abutting condition becomes in an "off (non-abutting)" state). While releasing the abutting condition, the elongated member is so moved backward up to a position that the abutting members are located next to trailing ends of the next successive materials to be treated, and then the elongated member is rotated in reverse so that the abutting members abut the trailing ends of the next materials to be treated. Thereafter, the elongated member moves forward again.

As described above, by repeating the forward movement and the backward movement of the elongated member as well as the abutting "on" and "off" states (like the abutting "on" state→the forward movement of the elongated member→the abutting "off" state→the backward movement of the elongated member), the materials to be treated are transported forward. It is noted that the distance between the abutting members as well as the number and the arrangement of the elongated members are the same as for the continuous members as described above. Such elongated member may be in the form of a rod, shaft or the like, and the rotation and the linear and reciprocal movement thereof may be carried out in any suitable manner.

The continuous member or the elongated member is simple in its structure and a means (such as a motor, a roller, a gear or the like) which drives such a member does not require any complicated mechanism. In addition, a complicated device which transports power to the member can be located outside the thermal treatment space. Further, when compared with an embodiment in which the materials to be treated are moved and stopped by using only gas, there is an advantage in that the movement and stop of the materials to be treated are ensured.

The thermal treatment apparatus having the gas floating-transporting apparatus as described above may comprise a loading part before the thermal treatment space which supplies the material to be treated to the thermal treatment space and an unloading part after the thermal treatment space which removes the treated material from the thermal treatment space. Each of the loading part and the unloading part preferably comprises a gas floating-transporting apparatus and a transporting means which are the same as those of the thermal treatment space. That is, upon the supply of the materials to be treated to the thermal treatment apparatus and the removal of the treated materials from the thermal treatment apparatus, it is preferable that the materials to be treated are supplied to the thermal treatment apparatus by means of the transporting means while they are floated by means of the gas floating means, and the treated materials are removed from the thermal treatment apparatus by means of the transporting means while they are floated by means of the gas floating means.

Heat which is required for the thermal treatment in which heat is added to the material to be treated may be supplied in any proper manner. In one embodiment, the thermal treatment may be carried out using heat (for example, radiation heat, conduction heat) supplied from a proper heat source which is provided below and/above the base plate. For example, using the heat source located below the base plate, the base plate is heated, and the objects placed on the base plate (by means of the stop of the ejecting gas) are heated by means of thermal conduction from the base plate. This embodiment may be referred to as a so-called a "hot plate type", and for example the base plate includes the gas ejection means such as nozzles which eject the gas. Even though such a base plate is used, the material to be treated may be thermally treated by heating it to a predetermined temperature by means of radiation from the base plate while the material to be treated is floated by means of the gas ejection means.

As the heat source for heating as described above, an electrically resistive means (such as an electric heater, a panel heater and the like), and a burner may be used which burns a liquid fuel (such as petroleum, kerosine and the like), and a gas fuel (such as manufactured gas, LPG and the like) may be used below the base plate. The heating means as the described above heats the base plate, which directly heats the material to be treated by means of the heat conduction and indirectly heats the material to be treated by means of the heat radiation. As another heat source, any suitable heat source may be provided above the materials to be treated (such as a heater or a heating lump), radiated heat from which may thermally treat the material to be treated.

Optionally, the gas which is used for floating may be heated beforehand, and it is ejected for the purpose of floating simultaneously with heating the thermal treatment space so as to thermally treat the material to be treated. Where the gas ejected for floating has been heated, the thermal treatment may be promoted even when the material to be treated is floated. For example, a heat exchanger is provided in a gas supply conduit system which ejects the gas so that it exchanges heat between a high temperature medium and the gas to be ejected and the heat indirectly obtained by the gas is used as an energy source for the thermal treatment of the material to be treated. Further, the gas may be heated by image radiation heating using for example an infrared lump which irradiates waves having thermally good absorption by the gas. Alternatively, the burner as described above may be provided outside of the gas supply conduit system to heat the gas to be ejected.

Where the gas is heated as described above, both of the floating and the thermal treatment may be simultaneously carried out by ejecting the heated gas toward the material to be treated. It is of course possible that both of heating by means of the base plate and heating by means of the ejected gas are used. As described above, various heat sources may be used, and it is important to select a heat source which is easily used, provides a best heating efficiency, and is less expensive depending on the thermal treatment method to be carried out.

In one preferable embodiment according to the present invention, the gas ejection means comprises a plurality of the gas ejection openings which are provided through the base plate, and the gas is ejected through the gas ejection openings at a predetermined speed. The number of the gas ejection openings provided in the base plate is not limited, and those skilled in the art would select it appropriately depending on the material to be thermally treated.

For example, in the case wherein the thermal treatment space of the thermal treatment apparatus is at a high temperature, the material to be treated itself is likely to deform because of its portions having various temperatures and temperature distribution across the thermal treatment space. Further, due to such deformation, the floating action of the material to be treated may be interrupted. In order to prevent such deformation, it is preferable that the gas is not ejected concentrically toward a single portion of the material to be treated, but ejected toward a plurality of portions of the material to be treated and preferably the floating force acts totally on the material to be treated as uniformly as possible; For the purpose of doing so, a plurality of the ejection openings are provided which are uniformly distributed with respect to the material to be treated. When the plurality of the gas ejection means are provided, a sure floating action can be achieved without disturbing a stable thermal treatment atmosphere by controlling a temperature and/or a flow rate of the gas ejected from each means. It is noted that in place of a single gas ejection opening, a plurality of the gas ejection openings each having a smaller opening may be used.

On the other hand, in the case wherein the material to be treated is relatively rigid at the thermal treatment conditions, the gas may be ejected concentrically toward a center of gravity of the material to be treated from the gas ejection openings which are collectively located below the center. In this case, in place of the plurality of the openings, a single gas ejection opening may be used. However, multi-point supporting is more preferable than single point supporting in a viewpoint of stable support, and thus it may be preferable to provide a plurality of the gas ejection openings.

It is noted that the ejection of the gas through the gas ejection opening affects fluidity of the atmosphere in the thermal treatment space. Particularly, when precise thermal treatment is required, carefully attention should be paid as much as possible to the ejection of the gas required for floating. For example, when the gas is ejected at a high speed, it causes unnecessary matters such as dust which deposits on an inner wall and the like of the thermal treatment space to be scattered, and the thermal treatment space may contain them which may provide adverse effects. Thus, such scattering of the matters which affect qualities of the material to be treated is preferably suppressed as much as possible. In order to do so, when a plurality of the gas ejection means are provided, they are preferably provided within an area where the floating force can act on the material to be treated. In other words, when the material to be treated is being floated, the material to be treated is located above all of the gas ejection openings which are ejecting the gas so as to float the material to be treated.

It is noted that the gas ejection means is so constructed that the gas ejected from the gas ejection opening collides with the material to be treated perpendicularly (usually the material to be treated is so located that it spreads horizontally, and thus the term "perpendicularly" corresponds to "vertically"), but optionally (as described later), the gas ejection means may be so constructed that the gas collides with the material to be treated non-perpendicularly.

Usually, the material to be treated is often in the form of a sheet of which thickness is much smaller than the other dimensions and has rectangular or square surfaces. In such a case, the material to be treated is preferably moved along a center line of the base plate (namely, a line which divides the base plate into two equal portions and which is parallel to the transportation direction) or a part around the center line (a center part) of the base plate. A single or a plurality of the gas ejection means are so provided on the center part of the base plate that the gas is ejected toward a center line of the material to be treated (namely, a line which divides the material to be treated into two equal portions and which is parallel to the transportation direction) or a center part of the material to be treated. Alternatively, the gas ejection means may be so provided on the whole of the base plate that all of the gas ejection means are uniformly distributed below the material to be treated (for example, in a staggered arrangement).

In the thermal treatment apparatus according to the present invention, where a plurality of the gas ejection means are collectively provided, they are so constructed that the gas is ejected in a direction at an angle from the horizontal direction within the range between 90° and 60° (for example, 90° corresponds to a perpendicular direction to a sheet form material to be treated when it is floated horizontally, and 60° corresponds to a direction inclined by 30 degrees from the perpendicular direction), whereby ejecting directions of the gases which are ejected from the gas ejection openings of the gas ejection means are intended to be toward the center portion of the material to be treated as much as possible, and a blowing force of the gas, and thus the floating force to the predetermined portions of the material to be treated are uniformly distributed which allows the stable floating-transporting and transportation. For example, the gases ejected from the gas ejection openings located below the material to be treated is all so biased that the gases are toward the center portion of the material to be treated, which is carried out by for example changing facing directions of the gas ejection means such as nozzles by an angle in the range between 90° (vertical and upward direction) and 60°.

In another embodiment, where a plurality of the gas ejection means are provided, they are divided into a plurality of groups, and the gas ejecting direction of each group is made different from the other groups. For example, the gas ejecting directions are made different as described above. For example, where the material to be treated is floated by a plurality of the gas ejection means which are arranged horizontally and perpendicularly to the transporting direction of the material to be treated, the group of the gas ejection means which eject the gas toward the center portion of the material to be treated are so adjusted that they eject the gas perpendicularly (and upward), while the groups of the gas ejection means which eject-the gas toward portions between the center portion and the edge portions of the material to be treated are so adjusted that they eject the gas in directions between the substantially perpendicular direction and an inclined direction toward the center portion of the material to be treated. In this way, the floating force is increased at the center portion of the material to be treated at which the weight of the material to be treated is concentrated, while the floating force is lowered at the peripheral portions of the material to be treated which are relatively light. Thus, the application of the floating force over the entire material to be treated is made uniform.

On the other hand, the groups of the gas ejection means which eject the gas toward the portions between the center portion and the edge portions of the material to be treated may be so adjusted that they eject the gas in directions between the substantially perpendicular direction and an inclined direction toward the edge portions of the material to be treated. In this case, the floating force is acted on an entire of the material to be treated, which results in the stable floating. In any case, the ejecting direction is preferably adjusted in the range between 90° and 60° as described above.

In one embodiment, the gas floating apparatus according to the present invention comprises the base plate which ejects the gas toward the object so as to float the object above it. The base plate comprises at least one recess (or channel portion) in which at least two gas ejection openings are provided. The gas ejection opening is opened preferably at the bottom of the recess so that the opening does not protrude from a main surface of the base plate. Thus, in this embodiment, a plurality of the gas ejection openings are present in the base plate, and these openings are preferably connected by the recess. The recess preferably has along its entire length a width which is larger than a diameter of the gas ejection opening. In the case where the gas ejection opening is in the form of a group of smaller gas ejection openings, the recess preferably has a width which is larger than a circle which surrounds the group. Thus, the recess surrounds the gas ejection means.

When the base plate has the recess, the gas ejection means are preferably so provided that they are arranged symmetrically with respect to a center line or a center point of the base plate. More preferably, they are arranged symmetrically with respect to the center line and the center point of the base plate. This gas floating apparatus may be used in combination with the above described transporting means so as to use as a gas floating-transporting apparatus. Thus, the present invention provides a gas floating-transporting apparatus which comprises such gas floating apparatus and such transporting means, and which may be applied to the thermal treatment apparatus similarly to that explained above.

In one preferable embodiment, a plurality of the recesses extend radially from a center portion or its vicinity of the base plate, and the gas ejection opening is provided at a center portion side end of each recess. Optionally, the gas ejection opening may be provided at an opposite side end of each recess if necessary. In this case, one end of each recess collects in the center portion of the base plate, but each end is separated from the other. In another embodiment, the recesses are integrated at the center portion of the base plate, and the gas ejection openings are present in the center portion where the recesses are integrated together. In this embodiment, the base plate includes a single gas ejection opening in place of the plurality of gas ejection openings, and in this case, the base plate includes the gas ejection opening which is opened in the center portion thereof and a plurality of the recesses which extend radially from the gas ejection opening. The arrangement of the recesses are more preferably as described below with reference to the drawings, in which the base plate includes a gas ejection opening at a center portion thereof and four gas ejection openings near corners of the base plate which are on diagonals of the base plate. It is noted that the gas ejection openings arranged as described above may be in the form of a relatively large single opening or relatively small plural openings.

In the gas floating apparatus as described above, the gas ejection speed is not particularly limited but it is preferably in the range between the subsonic speed and the sonic speed as described before. In this embodiment, the gas ejected from the ejection opening collides with the object followed by proceeding preferentially along the recesses toward the periphery of the object. The number, the depth, the length and the like of the recesses may be appropriately selected depending on the material to be treated.

What is to be particularly considered is that effective floating is achieved since the ejected gas is present for a longer period (i.e. a longer residence time) below the material to be treated when the gas flows as a longer distance as possible along the recess after it has been ejected from the gas ejection opening (on the other hand when the gas flows a shorter distance, the gas is not present below the material to be treated for a longer period so that the gas escapes from the periphery of the object in a shorter time without applying the floating force).

For example, when floating is carried out above a rectangular sheet form base plate, the gas ejection opening open at a center portion of the base plate at which the diagonals are crossing, and four recesses are so formed that the recesses extend from the crossing point, and additional openings are provided in those recesses. This embodiment is advantageous where the material to be treated is present over the entire base plate.

In the thermal treatment apparatus according to the present invention, since the gas is ejected into the thermal treatment space, the gas has to be removed from the thermal treatment space. Thus, an evacuation (or exhaust) port is provided with the thermal treatment apparatus, and the gas is removed from the thermal treatment space through the port. In order to prevent scattering of unnecessary matters such as the dusts due to the ejection of the gas, the evacuation port is preferably provided at a level below the gas ejection means, through which port the gas is removed from the thermal treatment space and recovered. In this manner, since the gas which has been used for floating the material to be treated is evacuated from the thermal treatment space soon, disturbing of the atmosphere in the thermal treatment space by the ejected gas is suppressed, so that clean and stable thermal treatment atmosphere can be easily maintained.

In the thermal treatment apparatus according to the present invention, when the transporting member is used, a cover (or a flow control cover) is preferably provided over an edge portion of the transporting member along the transportation direction of the material to be treated. The gas, which has been ejected from below the transporting member and flown over the back surface thereof and which is to rise at the edge portion of the transporting member, collides with the cover. As a result, the ejected gas is likely to preferentially flow toward the evacuating port which is located below the level of the transporting member. Therefore, the cover suppresses the gas stream which would otherwise flow over the top surface of the material to be treated. In this way, scattering of the unnecessary matters such as the dust due to the ejection of the gas is prevented. That is, the cover is able to suppress the fluidity change of the gas on a side of the material to be treated so as to suppress scattering of the unnecessary matters such as the dust without disturbing the atmosphere in the thermal treatment space.

With the thermal treatment apparatus according to the present invention, the material to be treated sometimes has to be treated in a clean atmosphere. In such case, the gas which is ejected from the gas ejection means should be at a high clean level. In order to clean the gas to be ejected, the gas is preferably filtrated by a gas purifying means such as a medium performance filter or a high performance filter which is often used for a clean room, a clean bench or the like. For example, a metal mesh or multi-layer structure filter may be used. Optionally, a gas clarifying means is necessary which removes from the thermal treatment atmosphere, gas or particles such as dust which is formed during the thermal treatment and which would otherwise deposit on the material to be treated and adversely affect its quality. In addition, where by recirculating the atmosphere of the thermal treatment space, heat is effectively utilized depending on its necessity, it is important to keep the atmosphere clean. In such case, a gas clarifying means such as a filter which withstands the temperature of the thermal treatment atmosphere may be used.

With the thermal treatment apparatus according to the present invention, where a gas called "factory air" is used as dry air for utilities of production lines and which is prepared by compressing ambient air using a compressor followed by dewatering thereof, such air is likely to include fine dust because the air is electrically charged due to its dryness. Thus, using such "factory air" as an atmosphere gas of the thermal treatment and as a floating gas to be ejected directly toward the material to be treated causes the dust to be deposited onto the material to be treated, which results in for example a short circuit problem where the material to be treated is a kind of an insulation material, and thus often results in a severe quality problem. The problems due to the electrically being charged of the gas are preferably overcome by a proper means which removes the charged state. For example, an ion generator which uses the corona discharge may be used so that the generated ions are mixed with the gas so as to electrically neutralize the electric charge, or moisturizing of the gas or a gas de-electricity means using a metal filter earth may be utilized so as to remove the electric charges. Such a device is preferably provided with the conduit system of the gas supply means.

According to the present invention, since the material to be treated is moved in the thermal treatment space by the transporting means while it is being floated, the material to be treated is transported without a friction resistance between the material to be treated and the other members such as the base plate so that the material to be treated is moved very easily. Thus, the material to be treated should be in the floating condition during a period when it is transported. After the material to be treated has been moved to the predetermined position, it is placed on the base plate by stopping the ejection of the gas and the predetermined thermal treatment is carried out. After completing the thermal treatment, similarly to the above, the material to be treated is floated by the gas, and transported to the next thermal treatment zone by means of the transporting means and the next thermal treatment is carried out.

Such a thermal treatment apparatus may be used for the thermal treatment of a raw substrate or an intermediate substrate for the production of the plasma display panel (PDP) or the solar cell panel. The substrate material used for such a panel may be made of for example a ceramic, a glass (such as a soda glass and other glass material having a high strain temperature), a metal or other structural material. For example, the thermal treatment of the material to be treated includes drying, firing and film formation of an electrically conductive material (such as silver or tin oxide), a dielectric material, a luminescence material (for red, green, blue color) and an insulation material in the case of the plasma display panel, and drying, firing and film formation of silver and a transparent electrically conductive material (such as tin oxide) and a semiconductor material in the case of the solar cell panel.

BRIEF DESCRIPTION OF THE DRAWINGS

FIG. 7 schematically shows states of steps of gas floating-transporting procedure using a thermal treatment apparatus according to the present invention in a cross-sectional side views of the thermal treatment apparatus;

Figure 1:
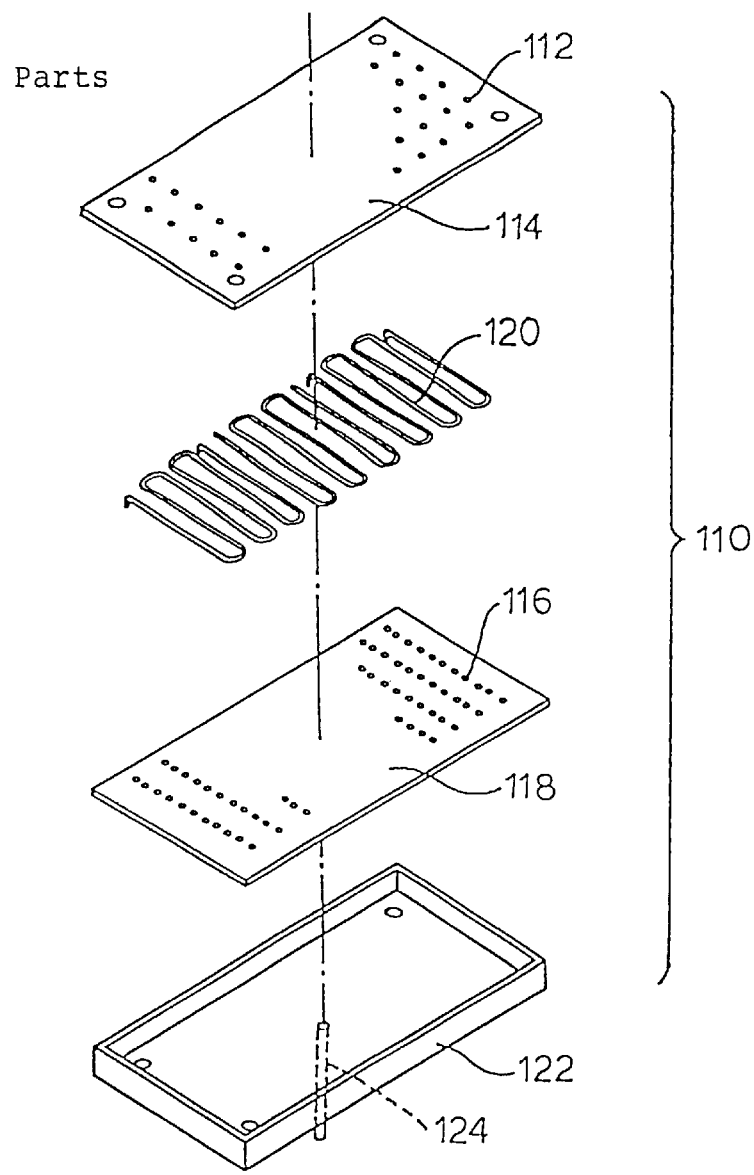
FIG. 1 schematically shows an exploded perspective view of a gas ejection means of a gas floating apparatus which may be used in a gas floating-transporting apparatus according to the present invention.

The reference numerals in the drawings refer to the following components:

1 . . . material to be treated, 2 . . . transporting member, 3 . . . gas floating means, 4 . . . pushing device, 5 . . . holding device, 6 . . . heating means, 7 . . . thermal treatment space, 8 . . . thermal treatment apparatus, 9 . . . material to be treated, 10 . . . continuous member, 11 . . . abutting member, 11' . . . additional abutting member, 12 . . . elongated member, 13 . . . abutting member, 14 . . . material to be treated, 15 . . . glass substrate, 16 . . . carrier tray, 17 . . . air floating unit, 18 . . . tray pushing device, 19 . . . carrier tray lifter, 20 . . . thermal treatment apparatus, 21 . . . material to be treated, 22 . . . transporting member, 23 . . . gas floating means, 24 . . . air supply conduit, 25 . . . pusher device, 26 . . . driving mechanism, 27 . . . holding device, 28 . . . driving mechanism, 30 . . . gas ejection means, 32 . . . gas ejection opening, 34 . . . nozzle plate, 36 . . . opening, 38 . . . intermediate plate, 40 . . . electric heater, 42 . . . lower casing, 44 . . . air supply conduit, 46 . . . bolt, 48 . . . spacer, 49 . . . bolt, 50 . . . thermal treatment apparatus, 52 and 52' . . . thermal treatment space, 54 . . . partition, 56 . . . insulating material, 58 . . . heater, 60 . . . gas ejection nozzle, 62 . . . base plate, 64 . . . gas supply conduit, 66 . . . valve, 68 . . . material to be treated, 80 . . . gas ejection means, 82 . . . gas ejection opening, 84 . . . base plate, 86 . . . recess, 110 . . . gas ejection means, 112 . . . gas ejection opening, 114 . . . nozzle plate, 116 . . . opening, 118 . . . intermediate plate, 120 . . . electric heater, 122 . . . lower casing, 124 . . . air conduit, 126 . . . bolt, 128 . . . spacer, 130 . . . gas supply means, 132 . . . gas floating means, 134 . . . gas clarifying filter, 136 . . . ion generator, 138 . . . heat exchanger, 140 . . . high temperature medium, 142 . . . transporting member, 144 . . . material to be treated (object), 146 . . . rail form member, 148 . . . pipe form member, 150 . . . transporting member, 152 . . . recess, 154 . . . nozzle member, 156 . . . shoulder portion, 158 . . . joint, 170 . . .

thermal treatment apparatus, 172 . . . thermally insulating wall, 174 . . . thermal treatment space, 176 . . . flat heater, 182 . . . exhaust port, 184 . . . evacuation conduit, 188 . . . transporting member, 190 . . . pusher, 1100 . . . thermal treatment apparatus, 1102 . . . electrical heater block, 1104 . . . heating muffle, 1106 . . . mesh belt, 1108 . . . material to be treated, 1110 . . . loading portion, 1112 . . . unloading portion, 1114 . . . cooling water conduit, and 1116 . . . cooling muffle.

DETAILED DESCRIPTION OF THE EMBODIMENTS OF THE INVENTION

The present invention will be explained in detail by means of concrete embodiments as examples with reference to the accompanying drawings.

FIG. 1 schematically shows an exploded perspective view of one example of the gas ejection means of the gas floating means which may be used for the gas floating-transporting apparatus according to the present invention. The gas ejecting means 110 comprises a nozzle plate 114 (which functions as a base plate) having a plurality of gas ejection openings 112 provided over an entire thereof and an intermediate plate 118 similarly having openings 116, and an electric heater 120 is provided above the intermediate plate 118. The electric heater 120 and the intermediate plate 118 are located within a lower casing 122, and the nozzle plate 112 is placed on the lower casing 122. An air conduit 124 is connected to the bottom surface of the lower casing 122, and air is supplied to gas ejection means 110 from a gas supply means (not shown). In the shown embodiment, the gas is ejected substantially perpendicularly and upward from all of the gas ejection openings 112. It is preferably that an area of the nozzle plate 114 is 90 to 100% of an area of a surface of a material to be treated which surface is opposite to the nozzle plate, and thereby an energy of the gas ejected from the gas ejection openings is relaxed by substantially first collision of the gas with the material to be treated so that unnecessary matters are unlikely to be scattered toward a top surface of the material to be treated.

Figure 2:
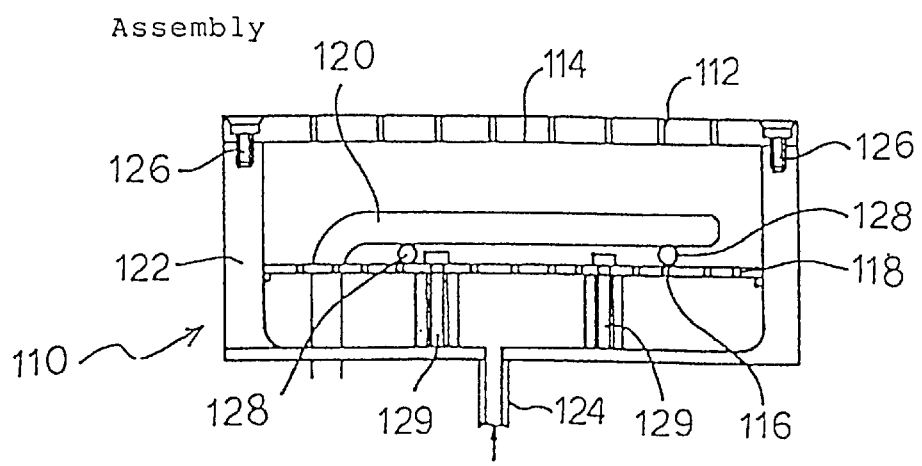
FIG. 2 schematically shows a cross-sectional view of a side of the gas ejection means of FIG. 1 in an assembled condition.

A side cross-sectional view of the gas ejection means 110 is schematically shown in FIG. 2 which is formed by assembling the embodiment explodedly shown in FIG. 1. The nozzle plate 114 is fixed to the lower casing 122 by bolt 126 at each of the four corners. The intermediate plate 118 is fixed at a certain level to the lower casing 122 by means of a bolt 129 with a spacer 128. The electric heater 120 is located on the intermediate plate 118 through a spacer 129 which avoids thermal expansion difference between the electric heater 120 and the intermediate plate 118. A pressurized air which is supplied through an air conduit 124 connected to a center portion of the lower casing 122 is rectified by the intermediate plate 118, and heated by the electric heater 120 followed by being ejected through the gas ejection openings 112 at an ejection speed in the range between the subsonic speed and the sonic speed. In the shown embodiment, the electric heater 120 heats, in addition to the air, the nozzle plate which heats and thermally treats the material to be treated (not shown) which is being floated by the ejected gas or the material to be treated (not shown) placed on the nozzle plate 114 by stopping the gas.

Figure 3:
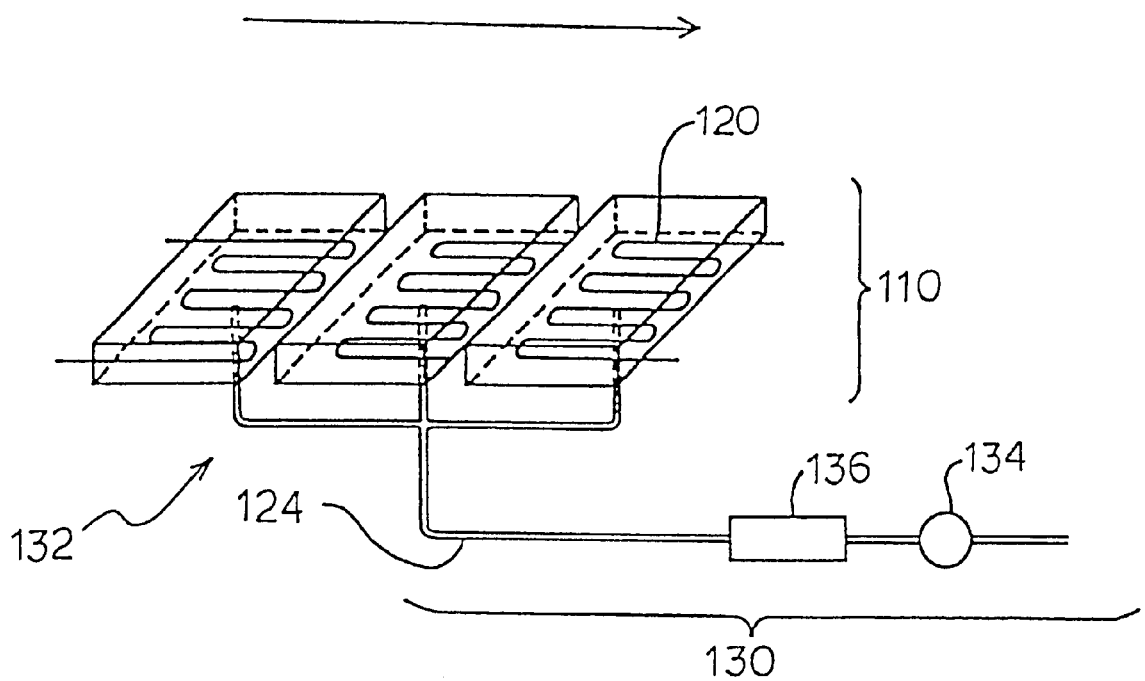
FIG. 3 schematically shows a perspective view of a gas floating means which may be used in a gas floating-transporting apparatus according to the present invention.

A gas floating means 132 is shown in FIG. 3 in a schematic perspective view which may be used for the gas floating-transporting apparatus according to the present invention and which comprises the gas ejection means 110 and the gas supply means 130 as shown in FIG. 1 or 2. In the shown embodiment, the gas ejection means 110 includes an electric heater 120 therein, and a gas supply conduit 124 of the gas supply means 130 has a gas clarifying filter 134 and an ion generator 136 using the corona discharge on its way. As a result, fine matters are removed from the gas to be ejected by the gas ejection means 110, and electrostatic charges of the gas are removed. In the shown embodiment, the gas stream branches on its way so that the gas is supplied from a single gas supply means to a plurality of the gas ejection means which are arranged along a direction (the direction as shown with the arrow) which is perpendicular to the transporting direction of the material to be treated. Such arrangement of the gas ejection means allows stable transportation of the object while preventing thermal deformation of the material to be treated. Further, a plurality of gas ejection openings (not shown) may be provided with the gas ejection means 110 arranged as described above, and the openings are divided into a plurality of groups, which control uniformity of the thermal treatment of the material to be treated and the flow rates of the ejected gas. Such gas floating means are so arranged in the thermal treatment apparatus that they are placed side-by-side along the transportation direction of the material to be treated (which direction is perpendicular to the arrow) and combined with a suitable transporting means, whereby the thermal treatment apparatus according to the present invention is formed.

Figure 4:
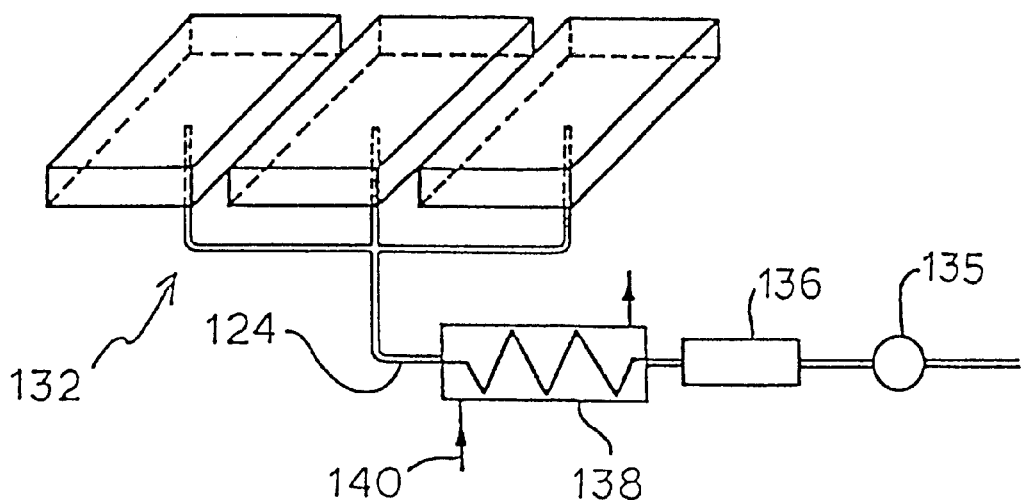
FIG. 4 schematically shows a perspective view of another gas floating means which may be used in a gas floating-transporting apparatus according to the present invention.

FIG. 4 shows a gas floating means 132 which is similar to that shown in FIG. 3. In the shown embodiment, the gas to be ejected obtains an amount of heat from a high temperature medium 140 in the heat exchanger 138 placed on a way of the gas supply conduit 124, and the obtained heat is used as a heat energy for the thermal treatment of the material to be treated. That is, the heated gas ejected by the gas ejection means 110 floats the material to be treated and also forms the thermal treatment atmosphere which thermally treats the material to be treated. The ejection of the gas is only a period of floating the material to be treated, and merely the ejection of the heated gas often provides insufficient heat and therefore it is preferable to co-use an electric heater (not shown in FIG. 4) as in FIG. 3.

Figure 5:
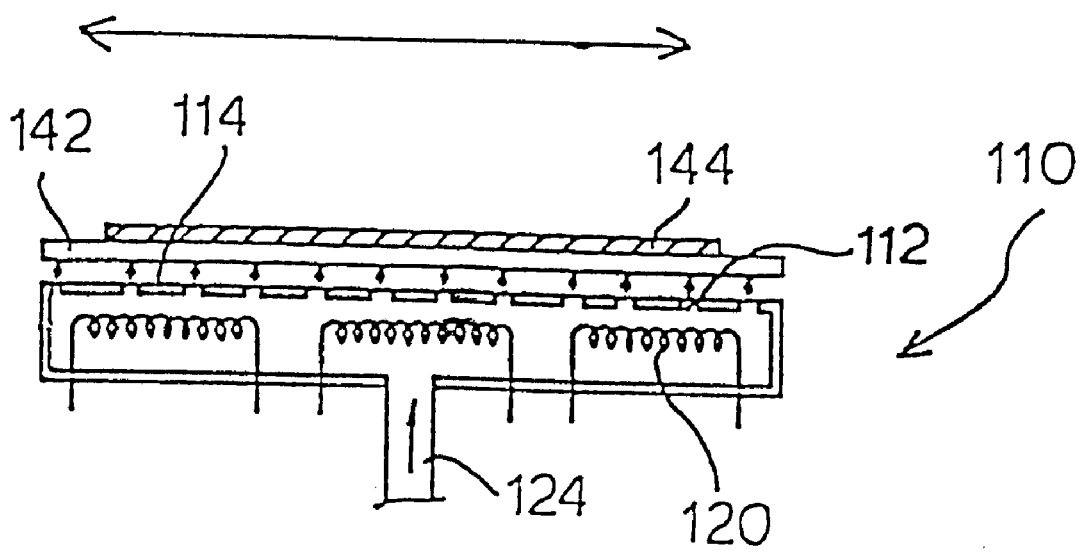
FIG. 5 schematically shows one embodiment of a gas ejection means which constitutes a gas floating means which may be used in a thermal treatment apparatus according to the present invention when viewing it from an end side of a material to be treated with respect to a transporting direction.

FIG. 5 schematically shows one embodiment of the gas ejection means 110 which forms the gas floating means which may be used for the thermal treatment of the present invention in a view when seeing from an end of a transportation direction of the material to be treated, namely a view when seeing from a side which is perpendicular to the transportation direction. The shown gas ejection means 110 ejects the gas through the gas ejection openings 112 uniformly distributed over the nozzle plate 114 at an ejection speed in the range between the subsonic speed and the sonic speed so as to float the transporting member 142, and the gas is supplied through the gas supply conduit 124. The material to be treated 144 (for example a glass substrate) is placed on the transporting member, and it is indirectly floated by means of floating the transporting member and transported by the transporting means (not shown) while being floated.

Electric heaters 120 are provided below the nozzle plate 114 which is heated by the heaters, and stopping the gas ejection places on the nozzle plate 114 the material to be treated 144 supported on the transporting member and the material to be treated is thermally treated. It is also possible to thermally treat the material to be treated 144 by means of the nozzle plate 114 while it is being floated. It is noted that in the shown embodiment, a plurality of the heaters 120 which are arranged side-by-side along the width direction in the gas ejection means allow improved uniform thermal treatment and also the ejected gas may be heated by the electric heaters 120.

Figure 6:
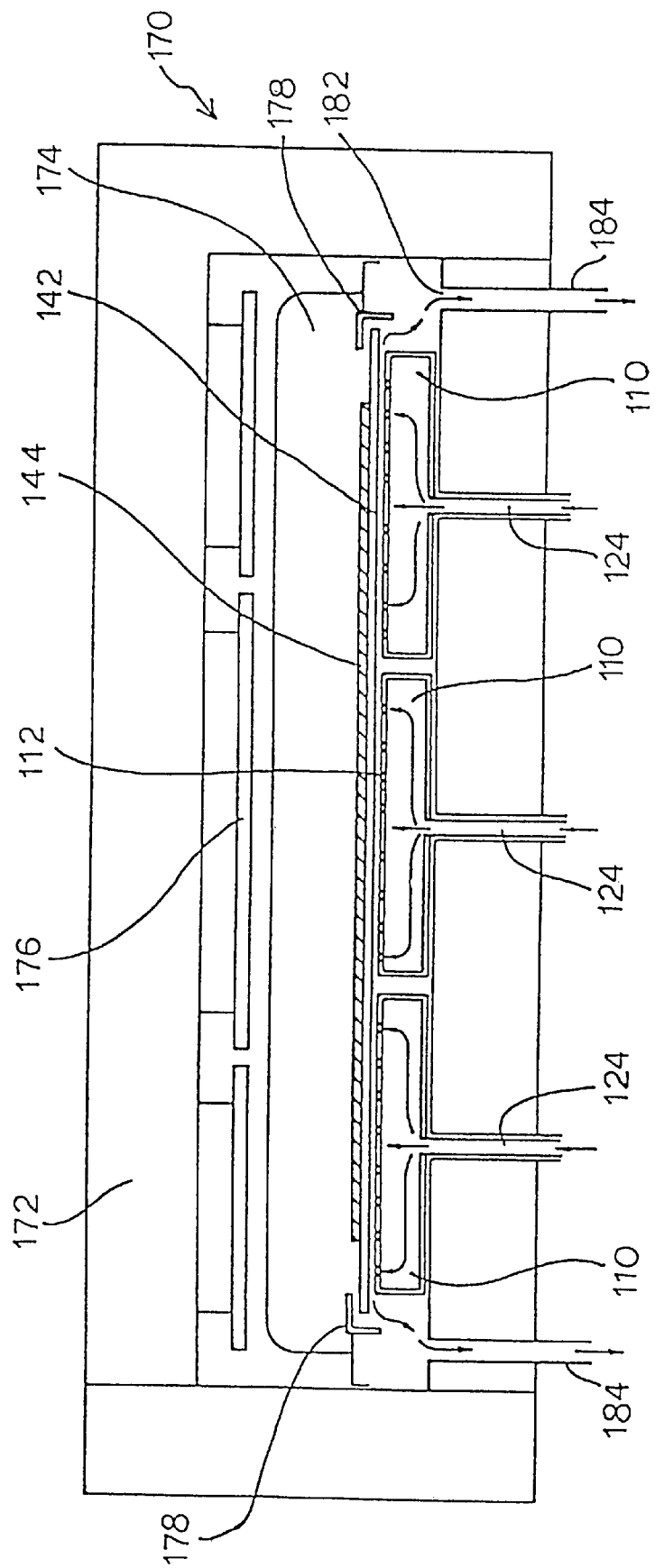
FIG. 6 schematically shows one embodiment of a thermal treatment apparatus according to the present invention when viewing it from its one end.

FIG. 6 schematically shows a view of one example of the thermal treatment apparatus according to the present invention when viewing from an end of the apparatus (or a cross-sectional view along a perpendicular to the transportation direction of the material to be treated). The shown embodiment may be applied to the thermal treatment of for example a glass substrate as the material to be treated for a plasma display panel or a solar cell panels in the thermal treatment apparatus.

The shown thermal treatment apparatus 170 comprises a thermal treatment space 174 surrounded by thermal insulating walls 172, a flat heaters 176 are placed on a ceiling side of the space which heat a top surface of the object, and the heaters heat the glass substrate 144 placed on the transporting member 142 from the top surface of the substrate. Pressurized air is supplied through an air conduit 124 which is connected to each of three gas ejection means 110 arranged along the width direction of the material to be treated, and ejected through the gas ejection opening 112 which is provided on the upper surface of the gas ejection means 110 so that the gas strikes the bottom surface of the transporting member 142, whereby the glass substrate 144 is floated together with the transporting member 142.

At that time, if unnecessary matters such as dust disperse and deposit on the top surface of the glass substrate 144, they adversely affect the substrate quality. Thus, a cover 178 is provided as a flow controlling cover which is located above an edge portion of the transporting member 142 along the transporting direction of the glass substrate 144. Thus, the ejected gas is prevented from flowing toward the top surface side of the glass substrate 112, and rapidly evacuated outside the thermal treatment space through a discharge conduit 184 from the discharge port 182 which is located below a level of the glass substrate 142.

FIG. 7 schematically shows a set of cross-sectional views of the thermal treatment apparatus which comprises the gas floating-transporting apparatus, namely views of the thermal treatment apparatus when viewing from its side. In the thermal treatment space 7 of the thermal treatment apparatus 8, a plurality of the substrates 1 as the materials to be treated are placed on the trays 2 as the transporting members. The trays are arranged side-by-side adjacently with no clearance between the trays along the predetermined direction which is a horizontal direction from the left hand side to the right hand side of the drawing.

Those materials to be treated 1 are for example heated up to a predetermined temperature so as to thermally treat them, and for such heating, the heating means 6 is provided in the thermal treatment space 7. In order that the trays 2 on which the materials to be treated 1 are placed are to be transported through the thermal treatment space 7 from the left hand side to the right hand side successively, a pushing device 4 (which may be also referred to as a "tray pushing devices" or a "pusher") is provided as the transporting means which pushes the tray 2, which is located adjacent to the left end of the thermal treatment space 7, toward the right hand side so that the tray 2 is pushed and supplied into the inside of the thermal treatment space.

The plurality of the trays 2 are so arranged side-by-side that there is substantially no clearance between the trays, and when the trailing end (or last) tray 2 is pushed into the thermal treatment space 7, each of the trays (except the leading end (or front) tray 2) which are arranged in front of the trailing tray transfers the pushing force to another tray which is located in front of each tray in sequence, so that all the trays are moved forward. In order that the trays 2 on which the materials to be treated 1 are placed are surely moved through the thermal treatment space, no gap is formed between the adjacent trays 2. The trays are stably held while being floated by the gas by using a tray holding device 5 provided at the unloading side in connection with the tray pushing device 4 at the loading side.

The tray holding device 5 functions to counteract the pushing action of the tray pushing device 4 (and thus, the trays 2 are held while being sandwiched by the pushing device 4 and holding device 5), so that it is ensured that the trays 2 are held stably in the thermal treatment space 7 while they are in the adjacent relationship. It is noted that in the shown embodiment, as to each tray 2 except the last tray 2, its preceding adjacent tray 2 which abuts the trailing end of each tray 2 (in particular, the front end of the preceding adjacent tray 2) corresponds to the abutting member, which also functions as the transporting means.

In addition, in the shown embodiment, the material to be treated 1 is place on the tray 2, but when the material to be treated has a relatively large thickness and a sheet form, the tray may be omitted and the gas is directly ejected toward the material to be treated so as to float it. Thus, in such a case, similarly to the above when focusing on a certain material to be treated, the abutting member is the preceding adjacent portion of the material to be treated, in particular its leading end, which functions as the transporting member.

If the trays 2 are moved to their front direction (to the right hand side direction in FIG. 7) as described above, starting from the state before movement shown in FIG. 7(a) in which the tray pushing device 4 and the tray holding device 5 are lowered, the gas is supplied to the gas floating means 3 from the outside by the gas supply means (not shown). The gas is ejected from the gas ejection means such as nozzles, and the ejected gas is directed to the bottom, surface of each tray 2 on which the material to be treated is placed. Then, the trays 2 are floated up to a floating level (or height) depending on an amount of the supplied gas, as shown in FIG. 7(b).

Thereafter, as shown in FIG. 7(c), by pushing the tray 2 at the loading side right and horizontally by means of the pushing device 4 while keeping the trays 2 in the adjacent relationship by the holding device 5, the plurality of the trays which are adjacent and contact with each other transfer the force to their front trays so that the floated trays 2 all are moved toward the right hand side direction. Upon such movement, there is an air layer between the gas floating means 3 and trays 2, almost no friction force acts so that pushing is carried out with a little force.

As shown in FIG. 7(d), when the air supply is stopped after the movement of a distance which corresponds to a length of one tray 2 has been completed, the trays are placed on and in contact with the gas floating means 3. Then, the trays 2 are kept in the thermal treatment space for the predetermined period so that the predetermined thermal treatment is carried out. Thereafter, the pushing device is moved to the left hand side and a fresh tray 2 is provided at the left end side. Further the right end side tray is removed so as to obtain the thermally treated material, whereby the one transporting cycle is completed. By repeating a sequence of (b) the gas floating step→(c) the transporting step by the pushing device while the materials to be treated being floated→(d) the gas stopping step to place the materials to be treated on the gas floating means→the thermal treatment step→(a) the step of unloading the treated material and loading the untreated material→(b) the gas floating step as one cycle as described above, the materials to be treated are successively moved and thermally treated.

Figure 8:
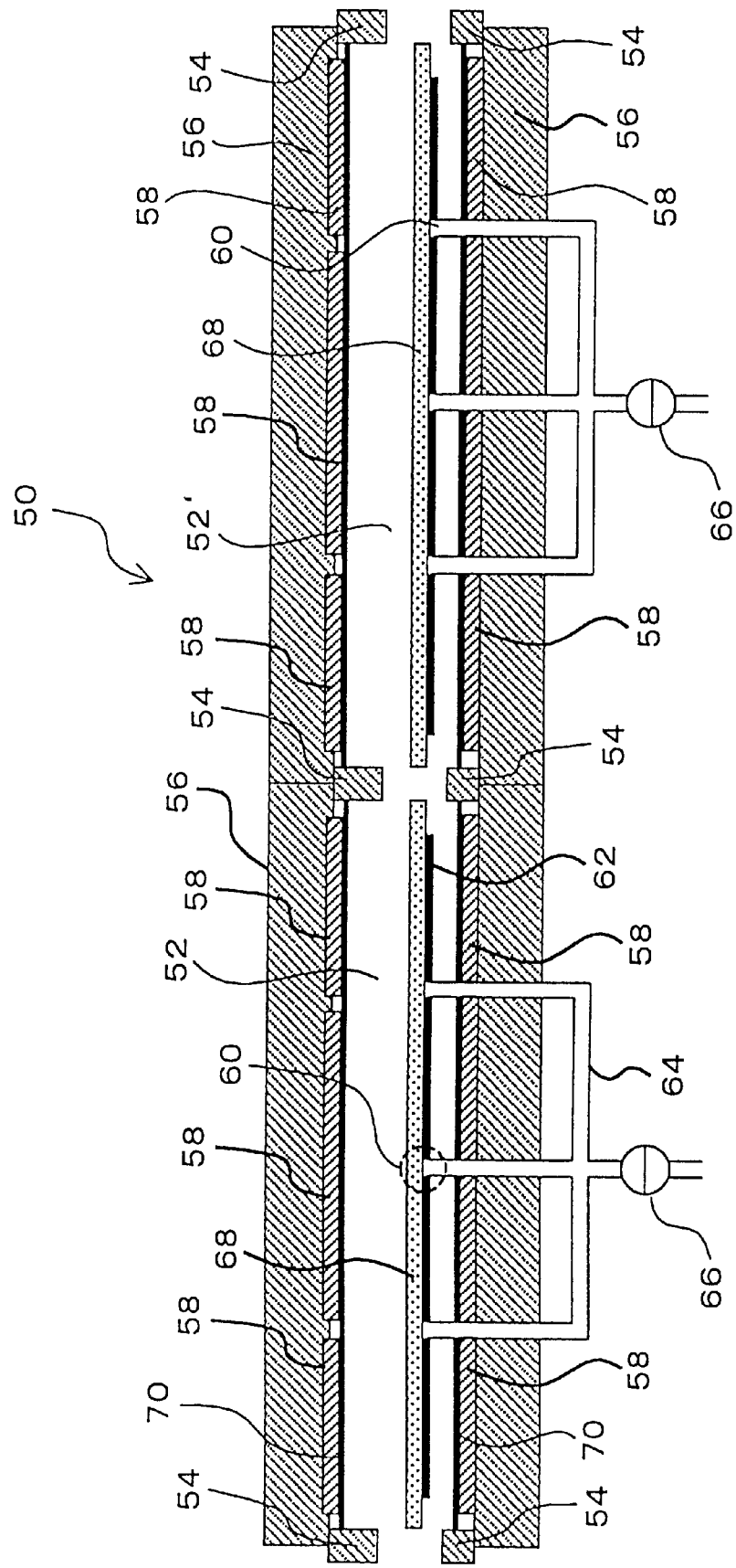
FIG. 8 schematically shows one state of a step of gas floating-transporting procedure using a thermal treatment apparatus according to the present invention in a cross-sectional side view of the thermal treatment apparatus.

The floating and transporting of the materials to be treated as described are shown in detail in FIGS. 8 to 11 in schematic cross-sectional views along the transporting direction of the materials to be treated. FIG. 8 corresponds to FIG. 7(a), FIG. 9 corresponds to FIG. 7(b), FIG. 10 corresponds to FIG. 7(c), and FIG. 11 corresponds to FIG. 7(d). In those drawings, only two thermal treatment chambers are shown for the simplicity, and the materials to be treated are directly floated and transported without using a transporting member. Further, the transporting means is omitted.

The thermal treatment apparatus 50 comprises the thermal treatment chambers 52 and 52' which are separated by the partition 54. The thermal treatment is carried out under the thermal treatment condition which is set by controlling the upper and the lower heaters 58 which are provided between the insulation wall 56 and the thermal treatment chamber. The base plate 62 having the gas ejection nozzles 60 is provided in the thermal treatment chamber as the gas ejection means to which the gas to be ejected (for example air) is supplied through the branched gas supply conduits 64 as the gas supply means. The supply of the gas is controlled by opening and closing the valve 66. In the state shown in FIG. 8, the valve 66 is closed and the material to be treated (such as a glass substrate) 68 is placed on the base plate 62. It is noted that although the materials to be treated 68 are so shown that there is a some space between them, there is substantially no space when the ends of the materials to be treated 68 also function as the abutting members which push other materials to be treated in front of them. The heater 58 is covered with a glass cover 70 so that the heater is not directly exposed to the thermal treatment space.

Figure 9:
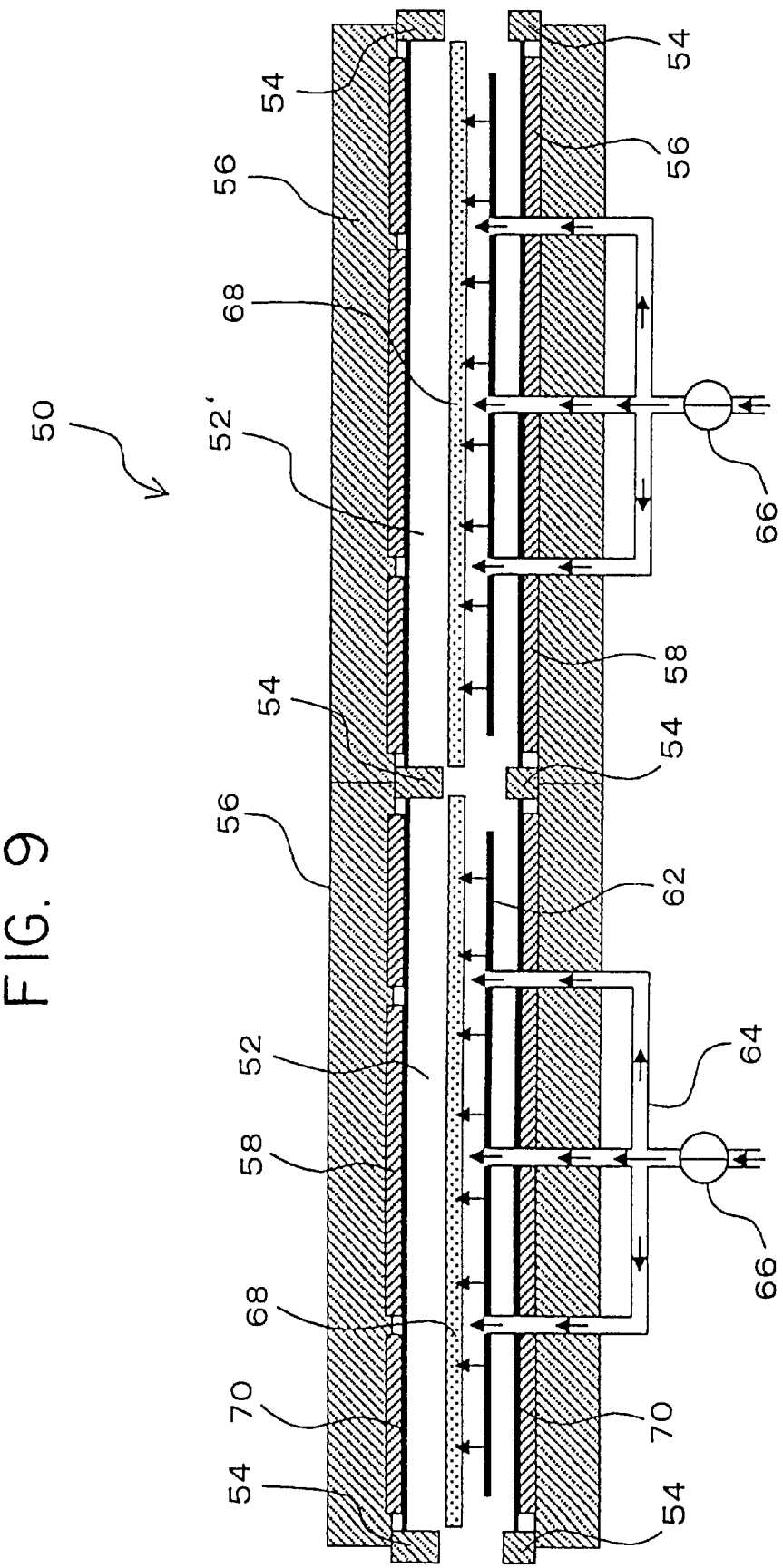
FIG. 9 schematically shows a state of a next step after the state of the step of the gas floating-transporting procedure of the thermal treatment apparatus according to the present invention of FIG. 8 in a cross-sectional side view of the thermal treatment apparatus.

In the embodiment shown in FIG. 9, the valve 66 is opened so that the gas is ejected from the openings of the gas ejection nozzles 60 (thus the gas ejection openings) and the materials to be treated 68 are floated, but the other features are similar to those of FIG. 8.

Figure 10:
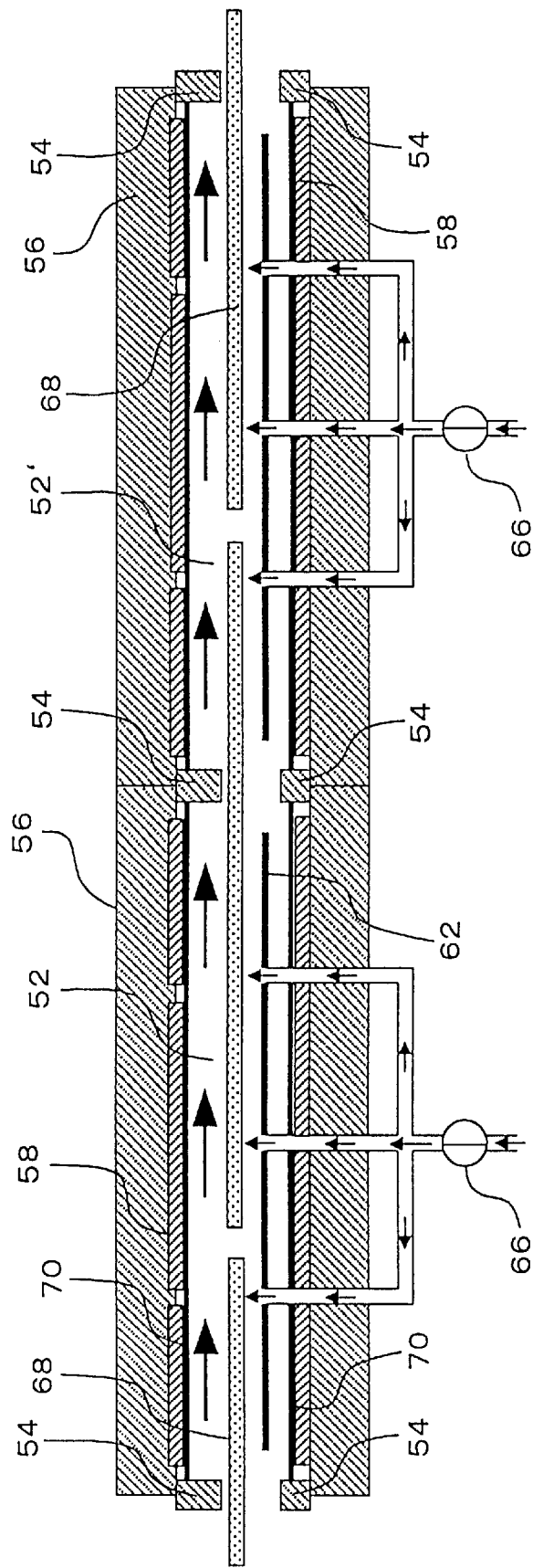
FIG. 10 schematically shows a state of a next step after the state of the step of the gas floating-transporting procedure of the thermal treatment apparatus according to the present invention of FIG. 9 in a cross-sectional side view of the thermal treatment apparatus.

In the embodiment shown in FIG. 10, the floated materials to be treated are being moved to the right hand side by the transporting members (not shown) as indicated by the larger arrows. For example, the materials to be treated 68 may be moved by the abutting members which are fixed to a chain. Alternatively, the pusher mechanism may be employed.

Figure 11:
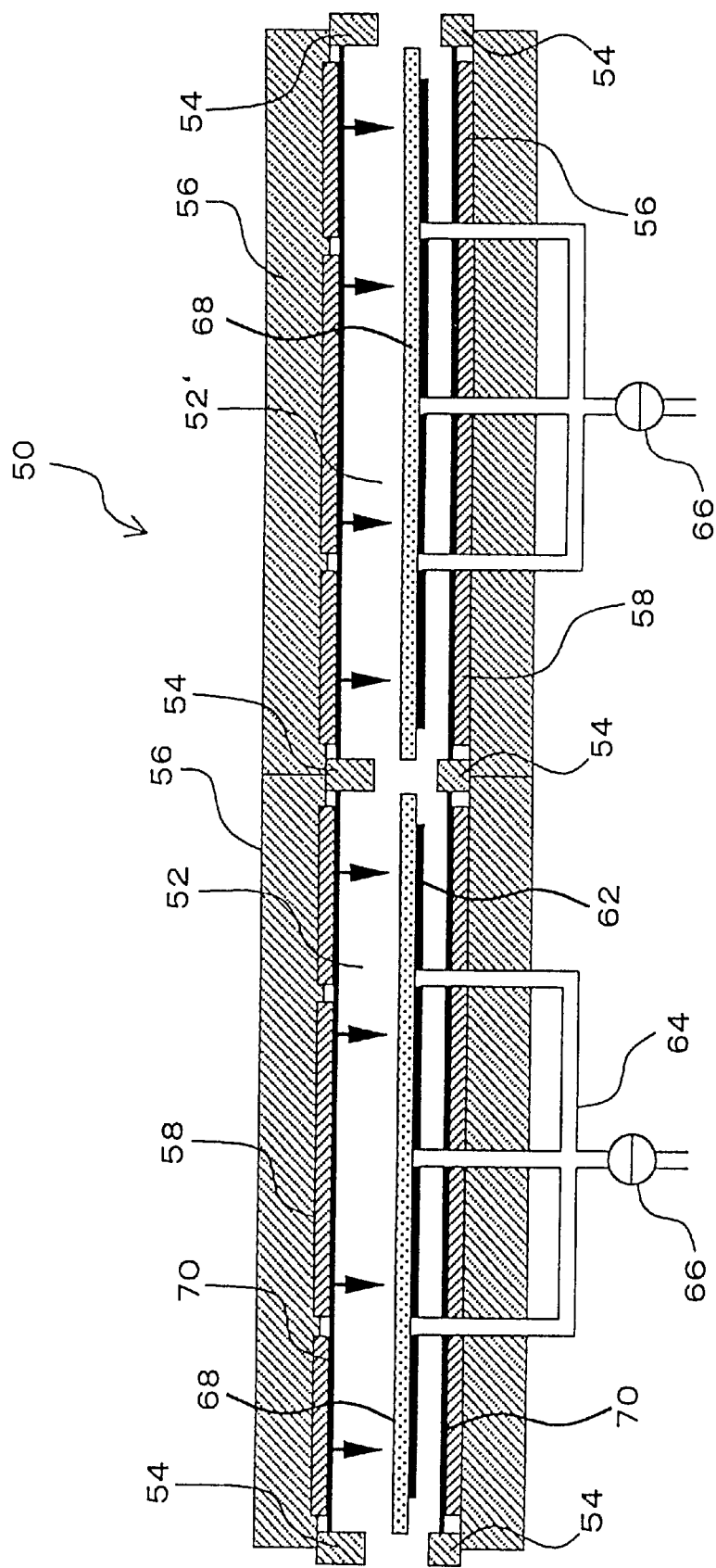
FIG. 11 schematically shows a state of a next step after the state of the step of the gas floating-transporting procedure of the thermal treatment apparatus according to the present invention of FIG. 10 in a cross-sectional side view of the thermal treatment apparatus.

In the embodiment shown in FIG. 11, the materials to be treated are lowered as shown with the arrows so that they are placed on the base plates by closing the valves 66 and stopping the gas ejection from the gas ejection means after the predetermined movement has completed and the materials to be treated have been transported to the next thermal treatment chambers. Thereafter, the thermal treatment is carried out until the next floating step. It is of course that the thermal treatment is carried out during a period from the state of FIG. 8 to the state of FIG. 11 since the predetermined thermal condition is kept in the thermal treatment space during such period.

Figure 12:
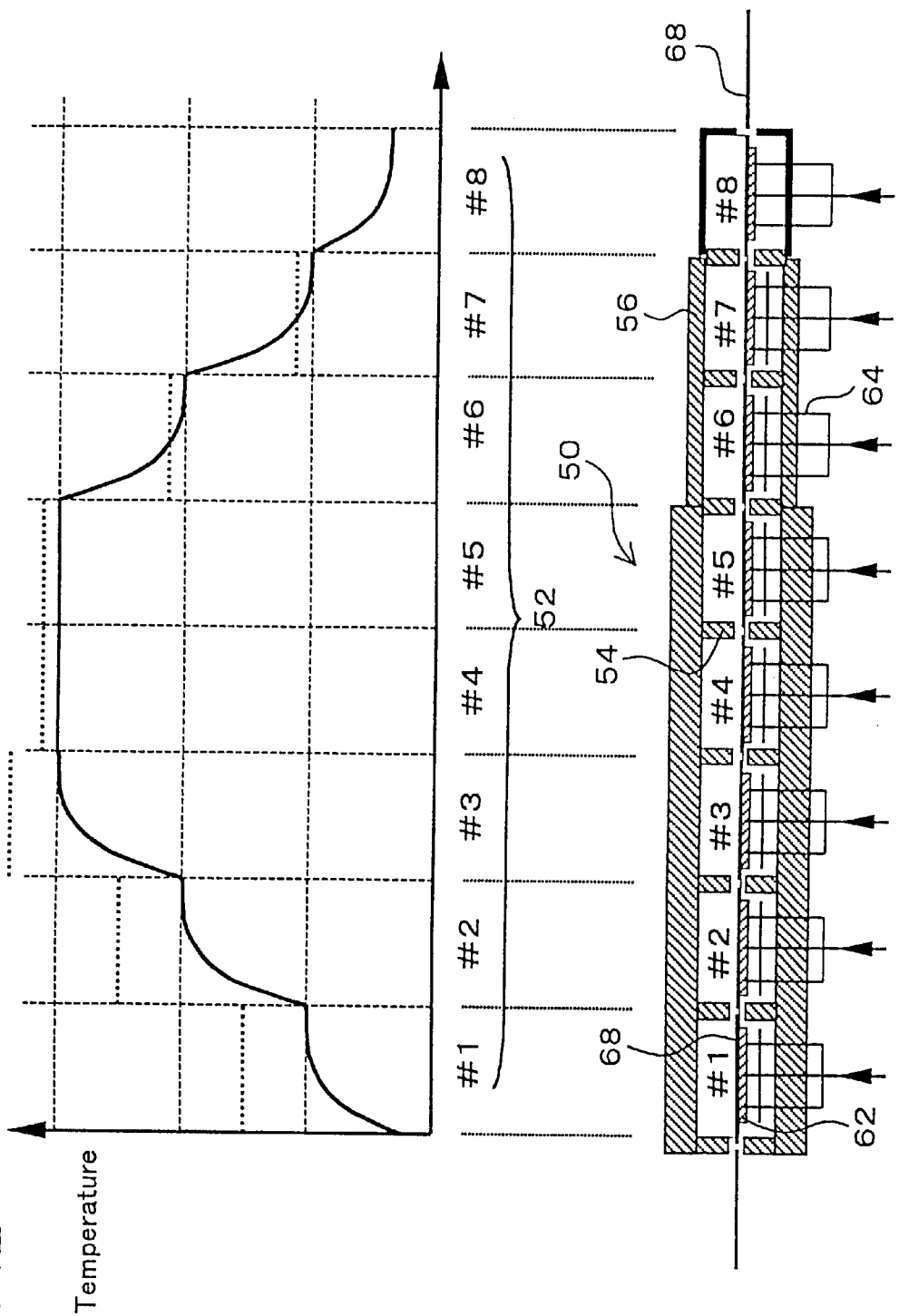
FIG. 12 is a graph which schematically shows temperature change of a material to be treated and a set temperatures of a thermal treatment space when a thermal treatment apparatus according to the present invention is used.

FIG. 12 shows a relationship between the temperature condition of the thermal treatment and the thermal treatment chambers No. 1 to 8 (#1 to #8) which constitute the thermal treatment space 52 of the thermal treatment apparatus. In the upper graph, the ordinate corresponds to the temperature and the abscissa corresponds to the position in the thermal treatment space which relates to the thermal treatment chamber. The positions of the thermal treatment chambers corresponds to the thermal treatment apparatus which is schematically shown below the graph. In the graph, the solid line indicates the temperature of the material to be treated 68, and the thicker dotted line indicates the set temperature of each thermal treatment chamber. The thermal treatment chamber #8 is a cooling zone, in which no positive heating is carried out, and thus no set temperature is shown. In the shown embodiment, the temperature of the material to be treated is changed as shown in the graph while it is transported through the thermal treatment chambers from #1 to #8, whereby the predetermined thermal treatment is completed.

It is not necessary that the thermal treatment is carried out only when the material to be treated is placed on the gas floating means. When the thermal treatment space is kept under the predetermined thermal treatment condition, the material to be treated is continuously thermally treated regardless whether the material to be treated is being floated or not floated as far as the material to be treated is present in the thermal treatment space. Further, placing the material to be treated onto the gas ejection means by stopping the gas ejection is not necessarily required, but the thermal treatment of the material to be treated while being floated is possible. However, it is preferable that the material to be treated is intermittently transported by repeating floating and placing it in order to save an amount of consumed air for floating and also to suppress heat loss by evacuating an atmosphere of the thermal treatment space.

Figure 13A:
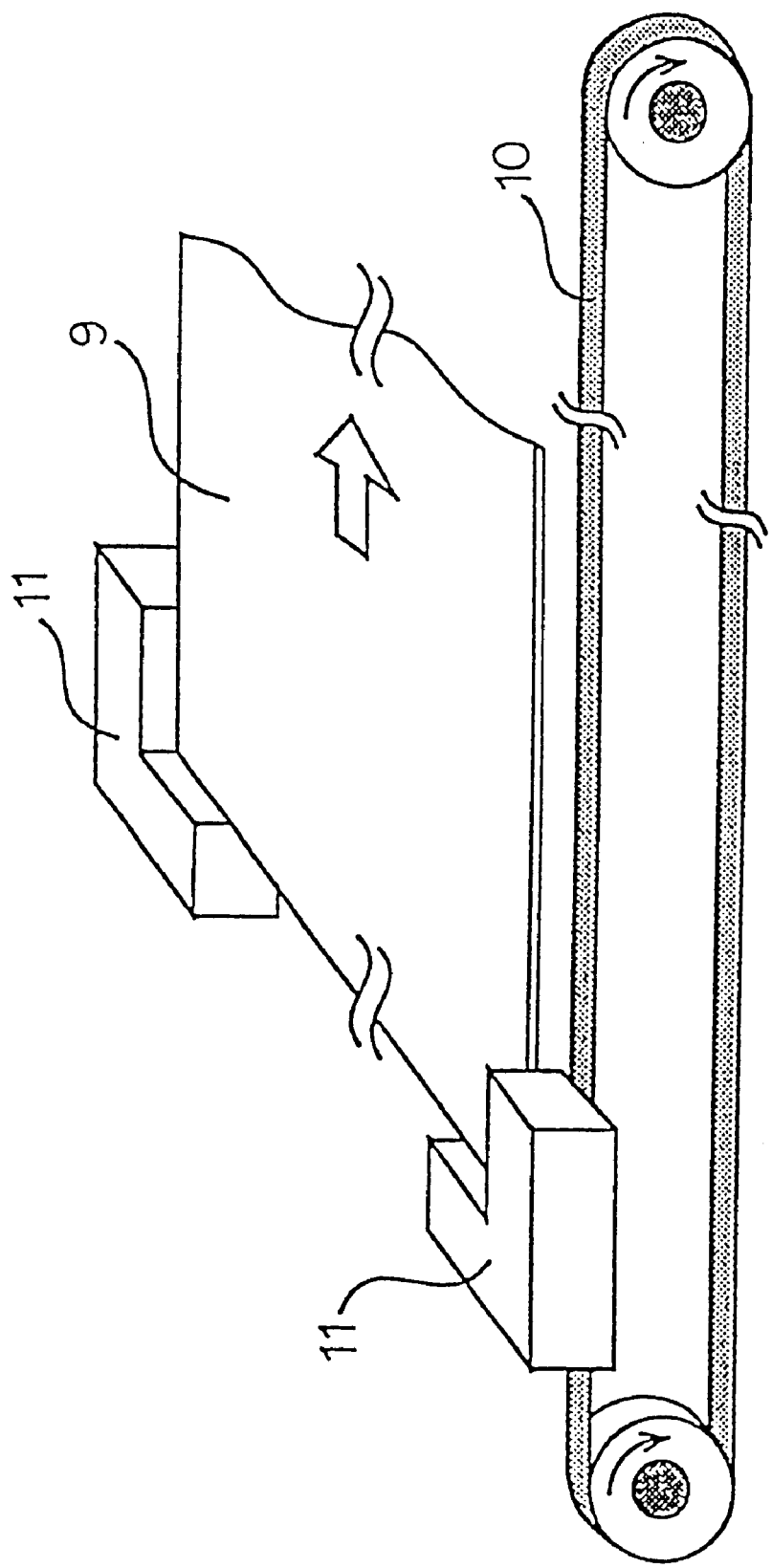
FIGS. 13(a) and 13(b) schematically show a holding and transporting mechanism of a material to be treated in a chain type manner or a wire type manner.
Figure 13B:
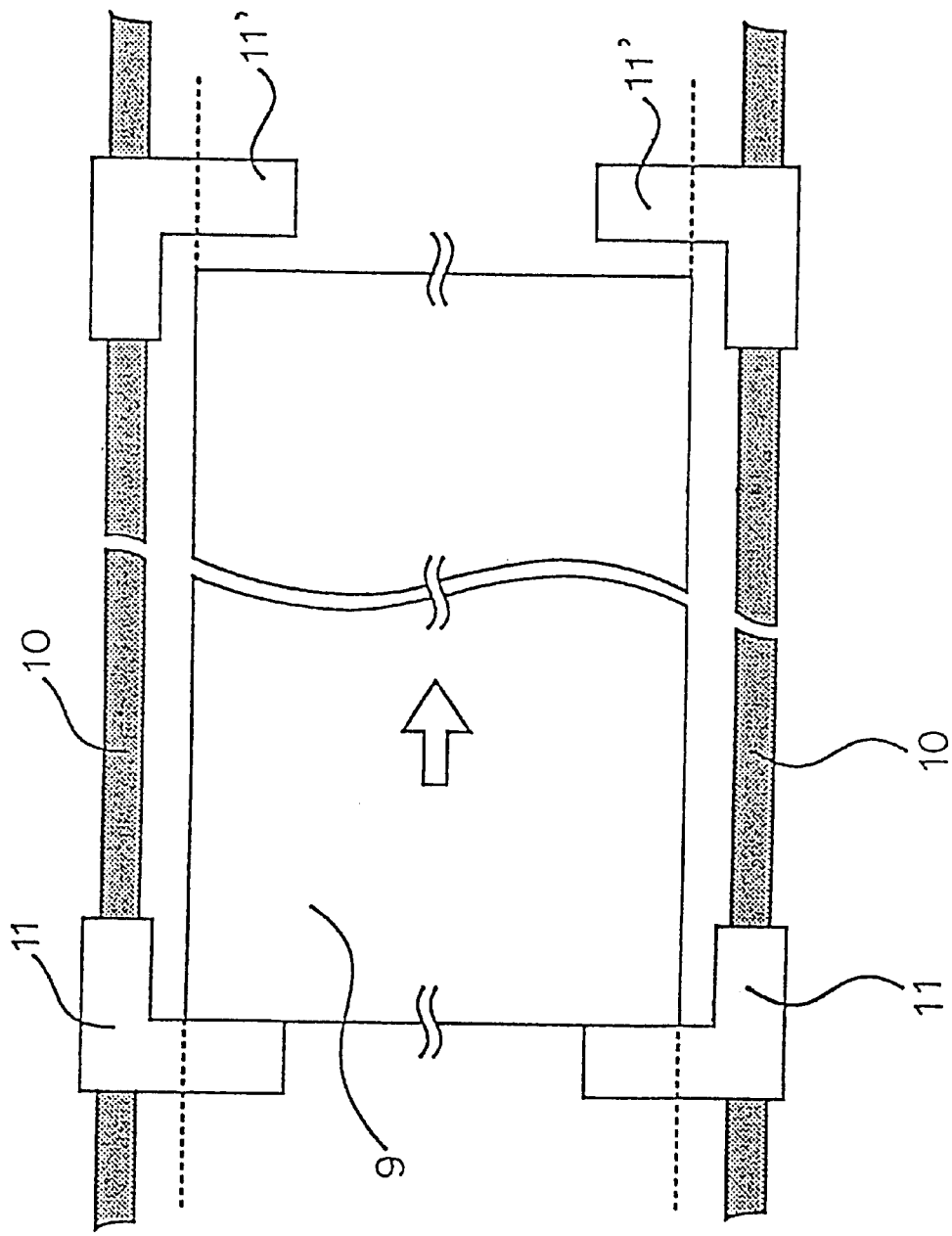

In FIG. 13, another embodiment of the gas floating-transporting apparatus according to the present invention is schematically shown. FIG. 13(a) is a perspective view and FIG. 13(b) is a plan view, and the gas floating means is omitted for the simplicity. In FIG. 13, the continuous members 10 such as a chain, a belt or a wire which moves toward the predetermined direction of the material to be treated 9 (the horizontal direction toward the right-hand side as shown with the arrow) are located along edges of the transporting path of the material to be treated (it is noted that only one continuous member is shown in FIG. 13(a)). Such a continuous member is moved along the predetermined direction by transmitting a power from a motor through a roller, a gear or the like.

The abutting members 11 which abuts the rear end of the material to be treated 9 which is floated by the gas ejection means is fixed onto the continuous member 10. When the continuous members 10 moves toward the predetermined direction along which the material to be treated is to be moved, the abutting member is adapted to push the objects 9 so that the material to be treated is moved toward the predetermined direction. When the movement of the continuous means is stopped, the abutting member stops, and thus the objects are stopped while being floated since the abutting member 11 does not further push the object 9. After stopping, the material to be treated may be optionally placed on the gas floating means (not shown) by stopping the gas ejection, and the thermal treatment may be continued. After the predetermined period has passed, the gas ejection is re-started so that the material to be treated is floated, and thereafter the continuous member 10 is driven so that the material to be treated is transported to the predetermined position.

In the shown embodiment, only one material to be treated is shown, but a plurality of such materials to be treated 9 may be arranged with evenly spaced from one another, and the abutting members 11 may be provided in the even spaces between the materials to be treated (thus, one of the adjacent abutting members is separated from the other member by at least a distance which corresponds to a length of the material to be treated). Thus, in the shown embodiment, the transporting means is a continuous member 10 which has the abutting members 11.

It is noted that, in the embodiment shown in FIG. 13(b), the abutting members 11 are provided on both edge ends of the materials to be treated and also additional abutting members 11' are provided at the front ends of the material to be treated. In this way, when the material to be treated 9 is stopped, movement of the material to be treated due to its inertia is minimized, which results in that the material to be treated is surely stopped at the predetermined position. In other embodiment, when focusing on a certain material to be treated, an abutting member 11 which is located in front of the material to be treated may function as such an additional abutting member.

The gas floating means may be in any suitable form, and it may be one as shown in FIG. 7, and such floating-transporting apparatus is arranged in the thermal treatment space. The thermal treatment and the transportation of the material to be treated may be substantially the same as those above explained with reference to FIG. 1 and carried out by repeating the cycle in which floating, transporting and thermal treatment are combined. It is noted that it is possible for the embodiment shown in FIG. 13 to continue the ejection of the gas without stopping and transport the material to be treated continuously by moving the continuous member very slowly.

By providing at least one abutting member, it can achieve its intended function, and depending the material to be treated, the number of the abutting members may be increased or the structure of the abutting member itself may be changed. Generally, the abutting member preferably abuts at or near each rear end (corner) of the material to be treated, and thus two abutting members are preferably used as shown in FIG. 13(*b*). When the width of the object 9 is larger, an abutting member may be provided at the center of the rear end, or the both abutting members at the corners may be connected together.

Figure 14:
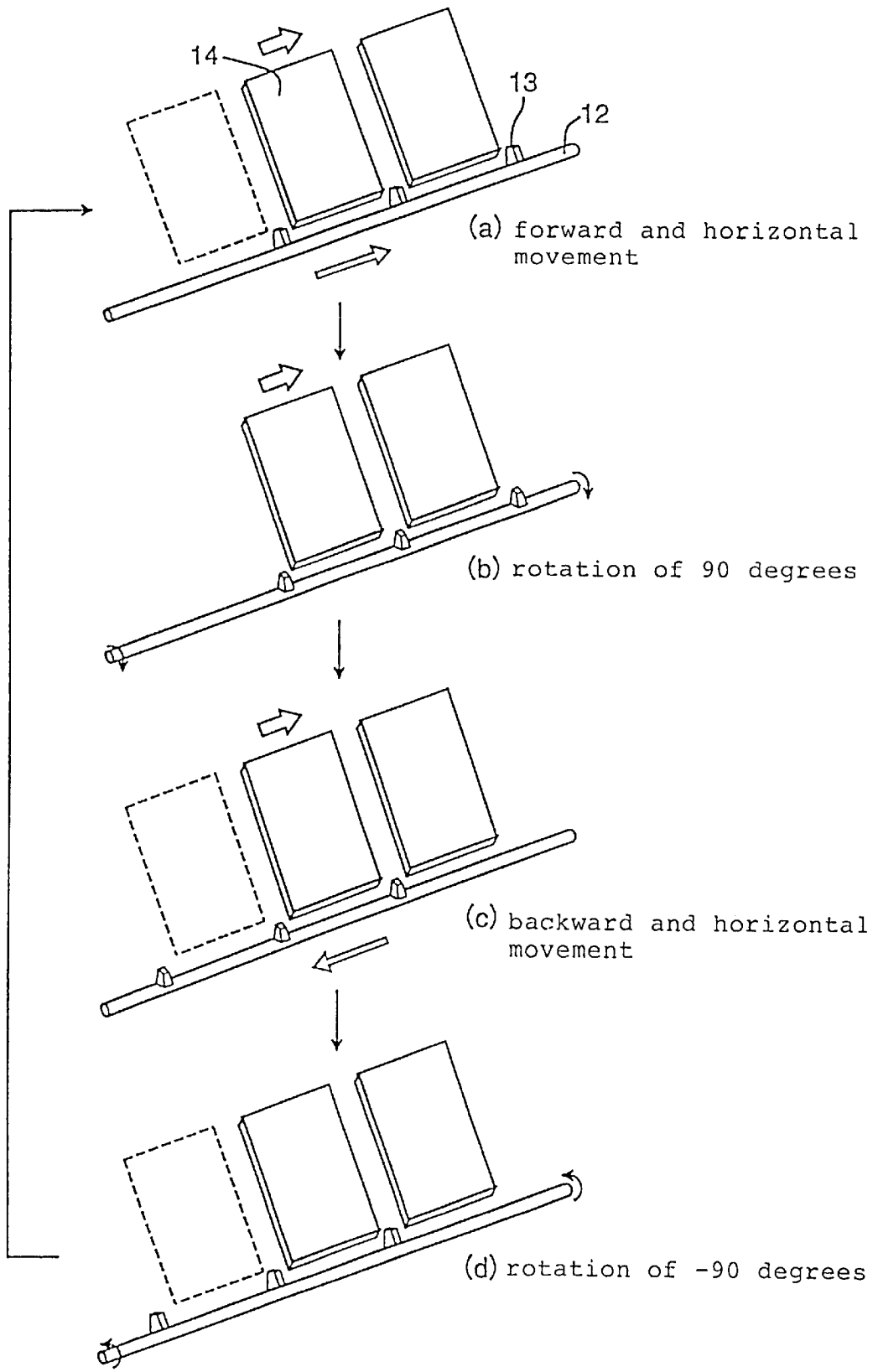
FIG. 14 schematically shows a holding and transporting mechanism of a material to be treated in a shaft type manner.

A further embodiment of the gas floating-transporting apparatus according to the present invention is schematically shown in FIG. 14 in perspective views (which are similar to views when seeing the apparatus slantly from the above thereof). It is noted that in FIG. 14, the gas floating means is omitted as in FIG. 13. In the shown embodiment, the elongated member 12 which has the abutting members 13 and which linearly reciprocates functions as the transporting means, which moves the materials to be treated 14 at a predetermined time toward a predetermined position along a predetermined direction (as shown with the thick white arrows). With such transporting mechanism, the elongated member can be so constructed that it does not substantially get out of the thermal treatment space, and thereby heat energy loss to the outside is little. It is noted that even with the continuous member 13 as shown in FIG. 13, the heat energy loss may be reduced when the continuous member is so constructed that it passes through the thermal treatment space when it is returned from the unloading portion to the loading portion.

FIG. 14 shows a transporting sequence in which reciprocation and rotation of a shaft member 12 as the elongated member are combined on which the abutting members 13 are provided with an even interval which is larger than a length of the material to be treated 14 along the transporting direction thereof. The abutting members 13 are so fixed to the elongated member 12 that they abut the rear ends of the materials to be treated 14 at least when they are being floated. There is no problem if the abutting members 13 abut the materials to be treated 14 when they are placed on the gas ejection means by stopping the gas ejection.

First, the state as shown in FIG. 14(*a*) is achieved in which the gas is ejected from the gas ejection means of the gas floating means so that the materials to be treated 14 are floated, and located between the abutting members 13. Then, when the elongated member 12 is linearly moved toward the direction of the arrow (the thin white arrow) by a distance which corresponds to a distance between two abutting members 13, the abutting members 13 push the rear ends of the materials to be treated forward, so that each material to be treated is moved forward by a distance which correspond to the length of one material to be treated.

Then, as shown in FIG. 14(*b*), the elongated member 12 is rotated around its axis as shown with a thin arrow, and then the elongated member 12 is linearly reciprocated in the reverse direction as shown in FIG. 14(*c*). Thereafter, as shown in FIG. 14(*d*), the elongated member is so rotated that the abutting members 13 may abut the materials to be treated at least when they are being floated. The angle around which the elongated member is rotated is not particularly limited, and for example it may be about 90°. As described above, the materials to be treated are intermittently transported by repeating (a)→(b)→(c)→(d)→(a).

In another embodiment, the abutting members 13 are so designed that they contact the materials to be treated 14 only when the materials to be treated are being floated and they do not disturb the linear reciprocation of the elongated member when being not floated, depending on the structure and the dimensions (especially, a vertical length) of the member. In this case, no rotation of the elongated member is required. It is noted that the thermal treatment may be carried out any time.

Figure 15:
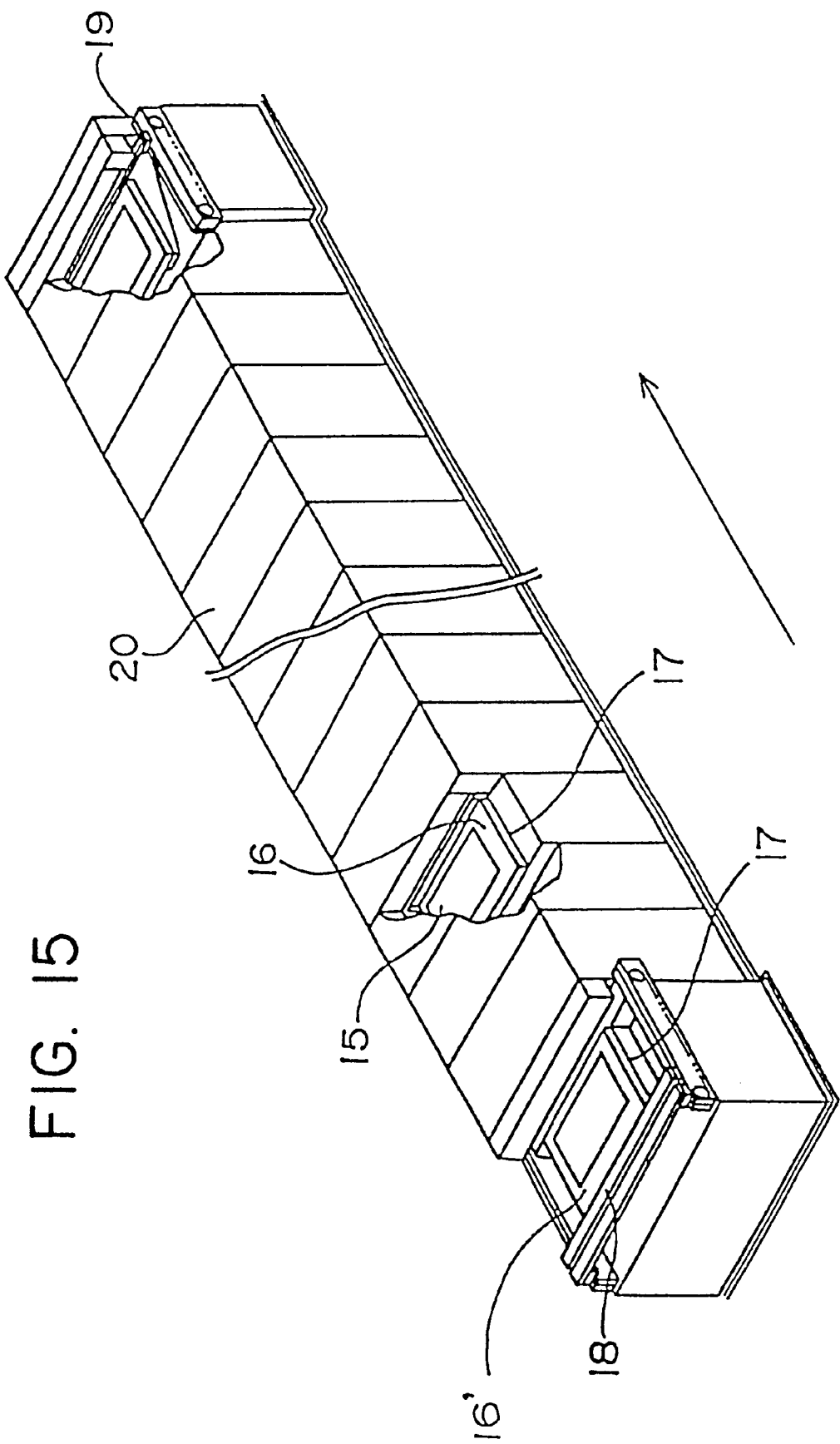
FIG. 15 schematically shows a perspective view of a thermal treatment apparatus according to the present invention of an air floated tray-pushing transportation type.
Figure 16:
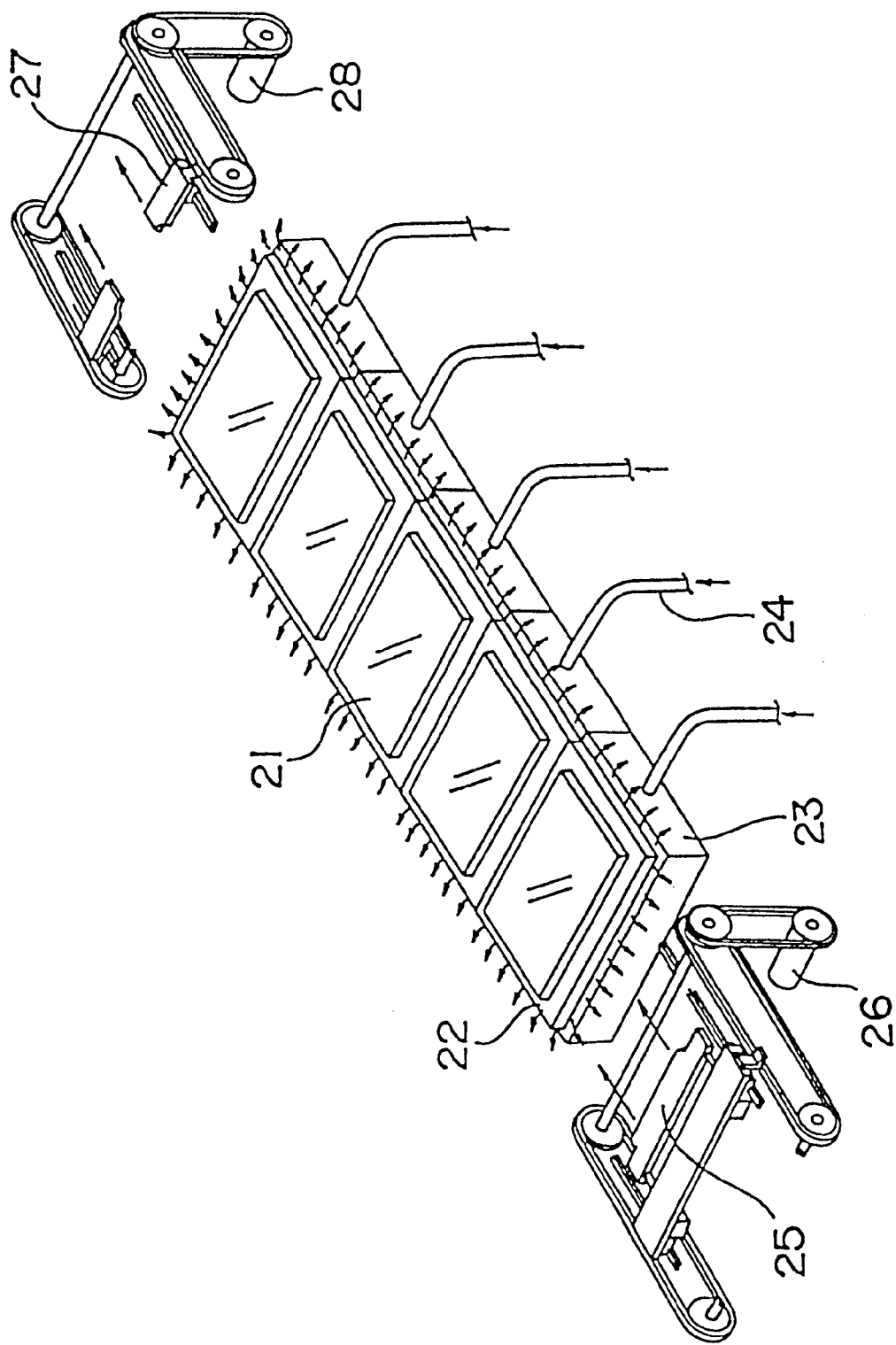
FIG. 16 schematically shows a perspective view of an inside of a transportation mechanism of the thermal treatment apparatus shown in FIG. 15, FIG. 17 schematically shows one example of a thermal treatment apparatus according to the present invention when viewing it from an edge of the apparatus.

FIG. 15 schematically shows the thermal treatment apparatus which comprises the gas floating and transporting apparatus according to present invention. The drawing shows more concretely the thermal treatment apparatus shown in FIGS. 7 to 11 in a partially cut-away perspective view. Also, FIG. 16 shows in a perspective view, the gas floating-transporting apparatus which can be used for the thermal treatment apparatus shown in FIG. 15.

The thermal treatment apparatus 20 according to the present invention is one which thermally treats a substrate material from which for example a plasma display panel is produced as a final product. According to the apparatus, the last carrier tray 16' on which a glass substrate 15 as the material to be treated is entered into the treatment space by means of the tray pushing device 18 which is provided at the loading side, and moved forward successively, so that it is transported through the thermal treatment space in the thermal treatment apparatus 20. In that embodiment, a plurality of the carrier trays 16 are so arranged in the thermal treatment space that they are adjacent and in contact with one another. The carrier tray 16 has a depth which is vertical to the transporting direction which depth is sufficiently larger than that of the substrate 15. By pushing the last carrier tray 16, the pushing force is transported successively to the carrier trays which are located in front of the last tray in the apparatus. Such transportation mechanism is a pushing type manner as described above.

When the tray pushing device 18 is to be operated, the carrier trays 16 should be floated. By using a compressor contained in the thermal treatment apparatus so as to supply pressurized air to the air floating members 17 and ejecting the air to the back sides of the carrier trays, the trays are floated. The thermal treatment may be carried out at any suitable time when the materials to be treated are present in the thermal treatment space. The substrate 15 of which thermal treatment has been completed and the carrier tray 16 are separated by the carrier tray lifter 19 at the unloading side, and the substrate 15 are taken outside of the thermal treatment apparatus 20.

In addition, when a transporting apparatus is used which is provided in an underfloor portion of or outside the thermal treatment apparatus, the carrier trays may be transported (or returned) to the loading side. Therefore, another glass substrate may be placed on the carrier trays, which are supplied into the thermal treatment space again for the next thermal treatment.

With the gas floating-transporting apparatus, as to the trays 22 arranged side-by-side, the last tray 22 is pushed forward by the pusher 25 of the tray pushing device, so that the trays located ahead of the last tray are moved forward. At that time, the holding means 27 of the tray holding device is so constructed that it moves forward in cooperation with pushing of the pusher 25. After pushing of the pusher 25 has been completed, the pusher 25 returns to its original position (in a direction opposite to the arrows), so that the next tray may be placed. Also, at the unloading side, the holding device 27 returns to its original position (in a direction opposite to the arrows). It is noted that the numerals 26 and 28 indicate driving systems which transmit power to the pushing device and the holding device.

Figure 17:
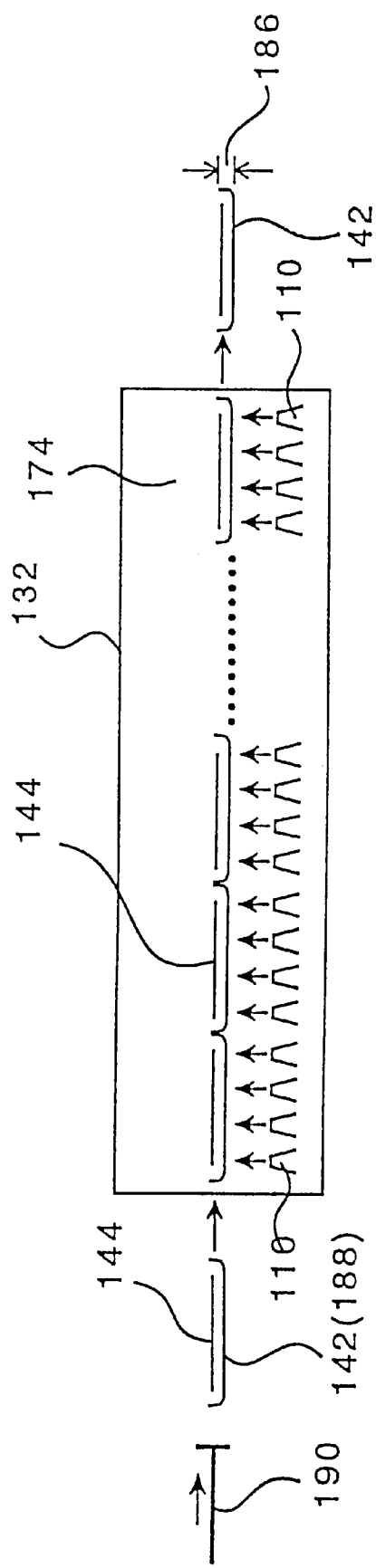

A further example of the thermal treatment apparatus according to the present invention is shown in FIG. 17 in a schematic view when seeing from a transverse side with respect to the transportation direction of the materials to be treated in the thermal treatment apparatus. In the shown embodiment, a plurality of the transporting members 142 which may be in the form of for example carrier trays are so arranged in the thermal treatment space 174 that they are adjacent and in contact with one another, and the materials to be treated are placed in the trays. While the transporting members 142 are transported along the transporting direction (shown with the arrow), they are floated by the gas ejected at an ejection speed in the range between the subsonic speed and the sonic speed from the gas ejection openings of the gas ejection means 110 which are provided below the transporting members 142, and moved by the transporting means (not shown). After the transportation has been completed, the gas ejection is stopped so that floating of the transporting members is stopped and the predetermined thermal treatment is carried out.

In the shown embodiment, the transporting member 142 has a dimension 186 vertical to the transporting direction of the object (shown with the arrow) which is sufficiently larger than a thickness of the object. When a force is applied along the transporting direction to the last transporting member of the adjacently arranged transporting members, the force is transmitted forward in turn such that the force is transmitted from the last transporting member to its ahead adjacent transporting member, and such force is further transmitted to its further ahead adjacent transporting member. Therefore, by pushing the last transporting member 188 forward (i.e. toward the transporting direction), all of the supporting members in front of the last transporting member can be moved. Thus, in the shown embodiment, the transporting means is a means which pushes a transporting member into the thermal treatment apparatus from its outside, and for example the pusher 190.

Such a transporting mechanism may be referred to as a pushing manner (or plug flow manner), and when such mechanism is provided in the thermal treatment space 174, the materials to be treated 144 as the objects placed in the transporting members 142 are successively moved, during which the materials to be treated are thermally treated. Since the transporting members themselves are floated by the gas ejected from the gas ejection means 110 located below the members, there is only a friction between the back side of the transporting members and the gas so that a force required for the transportation of the transporting members are minimized. In this embodiment, it is advantageous in that no transporting means are required to be provided in the thermal treatment space for the transportation of the materials to be treated or the transporting members.

Figure 18:
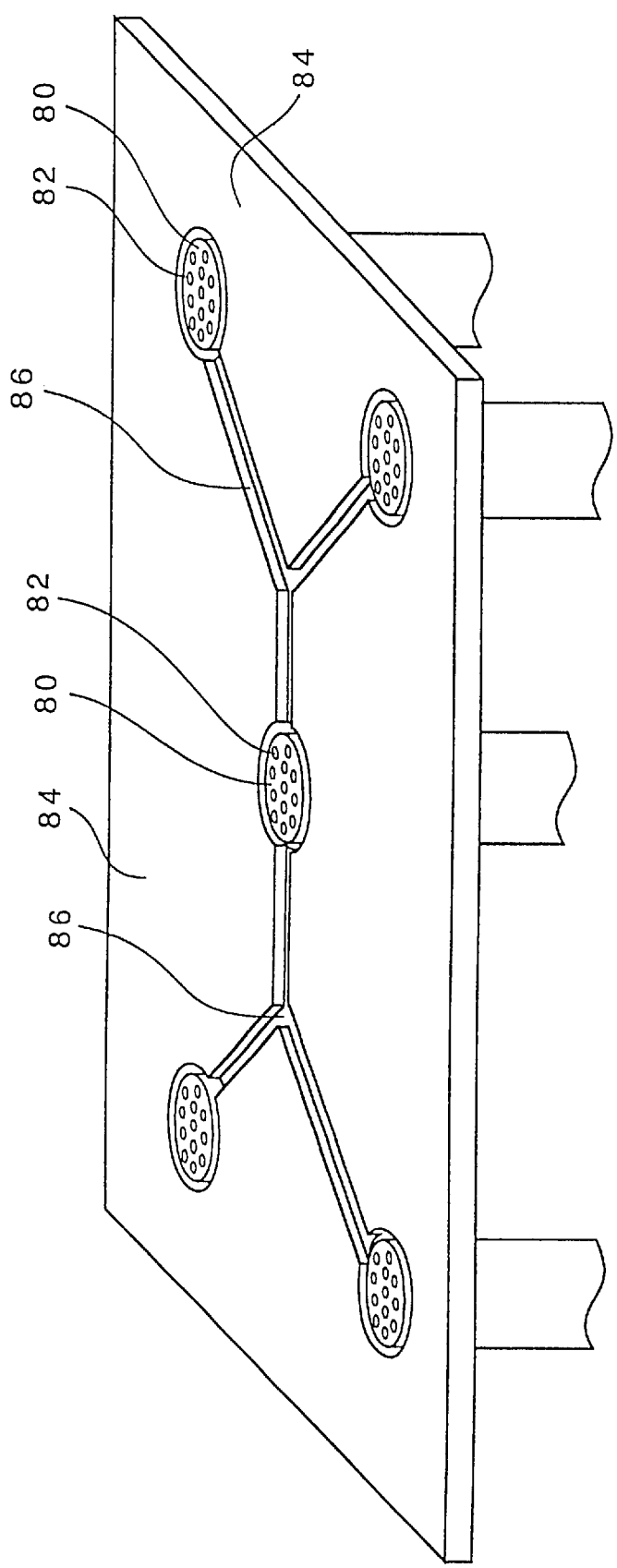
FIG. 18 schematically shows a perspective view of a base plate which includes gas ejection means according to the present invention.
Figure 19:
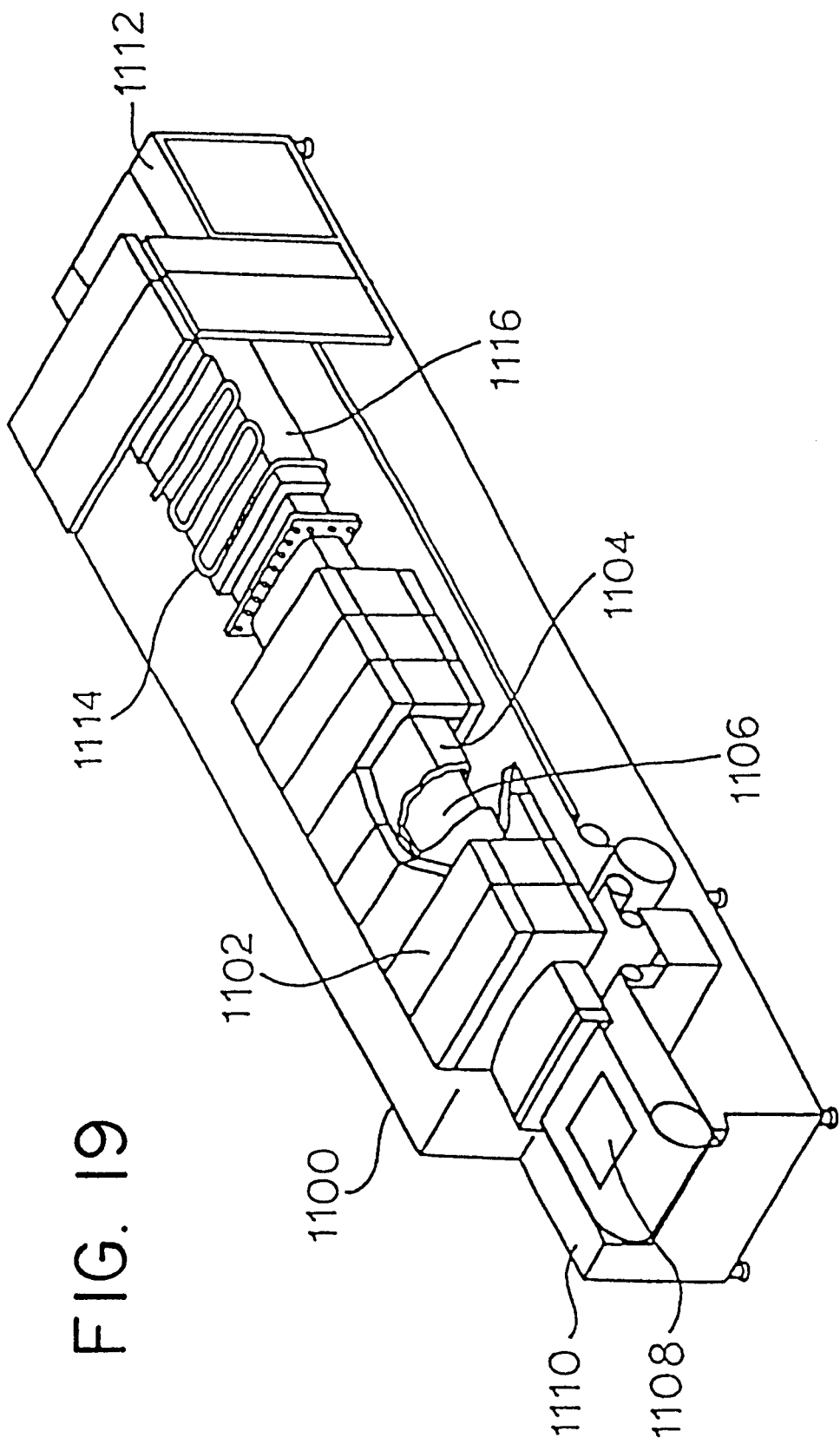
FIG. 19 schematically shows a perspective view of a thermal treatment apparatus of a usual mesh-belt transportation type of prior art.
Figure 20:
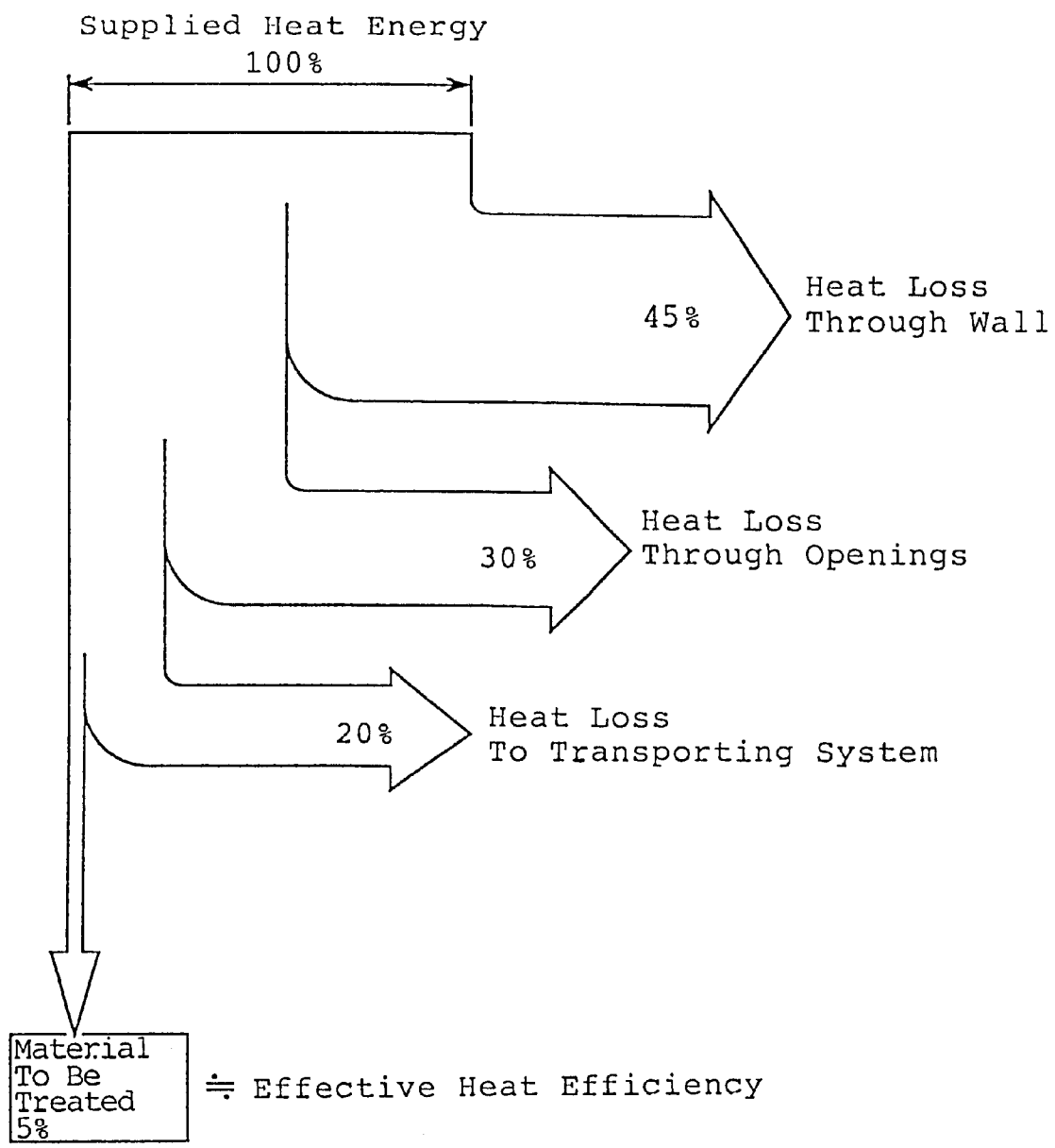
FIG. 20 is a graph which shows a heat balance of a usual thermal treatment furnace of prior art.

FIG. 18 schematically shows in a perspective view, a base plate 84 comprising an opening in which the gas ejection openings 82 of the gas ejection means 80 are provided. In the shown preferable embodiment, nozzle end surfaces which are the gas ejection means are arranged within the openings of the base plate, and the openings are connected by the grooves (i.e., channels) 86 provided on the base plate. The gas ejection means are provided at the center portion of the base plate and near corners on the diagonal lines of the base plate (totally four corners) in the shown embodiment. At the end surface of the gas ejection means, there is a group of the smaller gas ejection openings, through which the gas is ejected toward the material to be treated. With such an embodiment, the gas ejected from the gas ejection openings collides with the object and then is likely to preferentially follow the channels. Further, the ejected gas is likely to spread over the plate through the channels. Thus, an amount of the gas used for floating is effectively used, so that an amount of the used gas is reduced.

In the shown embodiment, the channels are so formed that they are symmetric as to a line and a point on the upper surface of the base plate. In one preferable embodiment, a shape of a cross-section of the recess perpendicular to the longitudinal direction of the recess is rectangular or semi-circular, and the depth of the recess becomes more shallow when being away from the ejection opening (i.e., having a so-called taper form).

Although the present invention has been explained mainly with the examples of the heating treatment, the floating apparatus, gas floating-transporting apparatus and the thermal treatment apparatus according to the present invention as described above may be applied to cases similarly to the above in which an object or a material to be treated is cooled or kept at a constant temperature, or subjected to various temperature changes. What is different is that heat is added to, removed from or screened from the object, and the above descriptions as to floating and transporting of the object are applicable to the thermal treatments other than the heating treatment.

EFFECTS OF THE INVENTION

When compared with the conventional thermal treatment apparatus of the belt conveyer type in which the belt transporting mechanism has a large heat capacity, the gas floating-transporting mechanism requires a very large amount of the gas, and product quality problem is caused by the dusts which are generated due to the frictions of the transporting means, the material to be treated is transported in the thermal treatment space while it is floated by ejecting a less amount of the gas according to the gas floating apparatus (or method), the gas floating-transporting apparatus (or method) or the thermal treatment apparatus (or method) using those apparatuses. As a result, mechanical structures which enter and leave the thermal treatment space is minimized, so that heat energy waste due to the heat removal by the transporting mechanism is suppressed as much as possible while ensuring the quality of the thermally treated material.

What is claimed is:

1. A gas floating-transporting apparatus comprising:
a gas floating mechanism including:
   a gas ejection device for expelling a gas toward a surface of a material to be floated such that a force applied against the surface of the material by the expelled gas is sufficient to float the material, and
   a gas supply device for supplying the gas to said gas ejection device;
a transporting mechanism including an abutting member for abutting an end of the material while the material is being floated by said gas floating mechanism, said abutting member being adapted to move in a predetermined direction so as to push against the end of the material and move the material in the predetermined direction while the material is being floated by said gas floating mechanism;
a thermal treatment space for thermally treating the material, said gas floating mechanism and said transporting mechanism being accommodated in said thermal treatment space;
a loading part for supplying the material to be thermally treated into said thermal treatment space, said loading part including a loading gas floating mechanism and a loading transporting mechanism; and
an unloading part for removing the material from said thermal treatment space, said unloading part including an unloading gas floating mechanism and an unloading transporting mechanism.

2. The apparatus of claim 1, wherein said gas floating mechanism further comprises a base plate, said gas ejection device including a plurality of gas ejection openings in said base plate for ejecting gas therethrough toward the material to be floated, said gas ejection openings being interconnected by at least one channel formed in an upper surface of said base plate.

3. The apparatus of claim 2, wherein said gas ejection device includes a plurality of said channels arranged symmetrically with respect to at least one of a center line and a center point of said base plate, each of said gas ejection openings being formed at a respective end of each of said channels.

4. A gas floating-transporting apparatus comprising:
a gas floating mechanism including:
   a gas ejection device for expelling a gas toward a surface of a material to be floated such that a force applied against the surface of the material by the expelled gas is sufficient to float the material,
   a gas supply device for supplying the gas to said gas ejection device, and
   a base plate, said gas ejection device including a plurality of gas ejection openings in said base plate for ejecting gas therethrough toward the material to be floated, said gas ejection openings being interconnected by at least one channel formed in an upper surface of said base plate;
a transporting mechanism including an abutting member for abutting an end of the material while the material is being floated by said gas floating mechanism, said abutting member being adapted to move in a predetermined direction so as to push against the end of the material and move the material in the predetermined direction while the material is being floated by said gas floating mechanism; and
a thermal treatment space for thermally treating the material, said gas floating mechanism and said transporting mechanism being accommodated in said thermal treatment space.

5. The apparatus of claim 4, wherein said gas ejection device includes a plurality of said channels arranged symmetrically with respect to at least one of a center line and a center point of said base plate, each of said gas ejection openings being formed at a respective end of each of said channels.

* * * * *